United States Patent
Kamogawa et al.

(10) Patent No.: US 8,828,642 B2
(45) Date of Patent: Sep. 9, 2014

(54) POSITIVE PHOTOSENSITIVE RESIN COMPOSITION, CURED FILM OBTAINED USING SAME, AND OPTICAL DEVICE

(75) Inventors: Masao Kamogawa, Otsu (JP); Toru Okazawa, Otsu (JP); Mitsuhito Suwa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 133 days.

(21) Appl. No.: 13/496,717

(22) PCT Filed: Sep. 16, 2010

(86) PCT No.: PCT/JP2010/066021
§ 371 (c)(1),
(2), (4) Date: Mar. 16, 2012

(87) PCT Pub. No.: WO2011/040248
PCT Pub. Date: Apr. 7, 2011

(65) Prior Publication Data
US 2012/0178022 A1  Jul. 12, 2012

(30) Foreign Application Priority Data
Sep. 29, 2009 (JP) .................................. 2009-223904

(51) Int. Cl.
G03F 7/004 (2006.01)
G03F 7/075 (2006.01)
G03F 7/40 (2006.01)

(52) U.S. Cl.
USPC ........ 430/270.1; 430/290; 430/321; 430/322; 430/330; 430/913; 430/950

(58) Field of Classification Search
USPC .............. 430/270.1, 290, 321, 322, 330, 950, 430/913
See application file for complete search history.

(56) References Cited

U.S. PATENT DOCUMENTS

| 6,384,254 | B1 * | 5/2002 | Omura ......................... 556/425 |
| 7,459,515 | B2 * | 12/2008 | Gommans et al. ............... 528/26 |
| 8,338,510 | B2 * | 12/2012 | Suwa ............................. 524/87 |
| 2006/0115766 | A1 * | 6/2006 | Suwa et al. ................ 430/270.1 |
| 2008/0107901 | A1 * | 5/2008 | Kosuge et al. ................ 428/391 |
| 2009/0048394 | A1 * | 2/2009 | Gommans et al. ............ 524/588 |
| 2009/0253886 | A1 | 10/2009 | Nishikawa |
| 2009/0318725 | A1 | 12/2009 | Takeuchi |
| 2009/0326183 | A1 * | 12/2009 | Schultz et al. ................ 528/196 |
| 2011/0118406 | A1 * | 5/2011 | Mowrer et al. ............... 524/539 |
| 2012/0237873 | A1 * | 9/2012 | Fujiwara et al. ........... 430/280.1 |

FOREIGN PATENT DOCUMENTS

| JP | 2001081404 A | * | 3/2001 |
| JP | 2003-75997 A | | 3/2003 |
| JP | 2006-29337 A | | 10/2006 |
| JP | 2006-312717 A | | 11/2006 |
| JP | 2007-122029 A | | 5/2007 |
| JP | 2007-246877 A | | 9/2007 |
| JP | 2008-24832 A | | 2/2008 |
| JP | 2009-204805 A | | 9/2009 |
| JP | 2010-33005 A | | 2/2010 |

OTHER PUBLICATIONS

Machine translation of JP 2001-081404 (no date).*
Machine translation of JP 2007-246877 (no date).*
Machine translation of JP 2010-033005 (no date).*

* cited by examiner

*Primary Examiner* — Amanda C. Walke
(74) *Attorney, Agent, or Firm* — Birch, Stewart, Kolasch & Birch, LLP

(57) ABSTRACT

Disclosed is a positive photosensitive resin composition which is characterized by containing (a) a polysiloxane that is synthesized by hydrolyzing and partially condensing a specific organosilane and an organosilane oligomer, (b) aluminum compound particles, tin compound particles, titanium compound particles, zirconium compound particles, composite particles of the aforementioned compounds or composite particles of any of the aforementioned compounds and a silicon compound, (c) a naphthoquinonediazide compound and (d) a solvent. The positive photosensitive resin composition is also characterized in that the organosilane oligomer contains a specific organosilane. The positive photosensitive resin composition has achieved excellent sensitivity and resolution without deteriorating high refractive index and high transparency.

15 Claims, No Drawings

POSITIVE PHOTOSENSITIVE RESIN COMPOSITION, CURED FILM OBTAINED USING SAME, AND OPTICAL DEVICE

TECHNICAL FIELD

The present invention relates to a positive photosensitive resin composition, a cured film obtained by using the same, and an optical device.

BACKGROUND ART

In recent years, with the rapid development of digital cameras and camera cell-phones, a smaller-sized, high-resolution solid state image sensor is required. Since miniaturization of the solid state image sensor causes deterioration of sensitivity, light is collected efficiently to prevent the deterioration of device sensitivity by locating a collecting lens between an optical sensor part and a color filter, or above the color filter, or by forming an optical waveguide between an optical sensor part and a color filter. Examples of a common method of preparing the collecting lens or the optical waveguide include a method in which an inorganic film formed by a CVD process or the like is processed by dry etching and a method of applying a resin to a substrate and processing the substrate. In the former method, it is difficult to attain a refractive index of 1.65 to 1.90 which is optimum for a lens or an optical waveguide, and therefore the latter method is currently attracting attention.

Heretofore, for example, an alkali-soluble polymer such as polyamide acid, a compound having a phenolic hydroxyl group, a positive photosensitive resin composition containing a quinone diazide compound and inorganic particles (e.g., Patent Document 1), and a silicone copolymer having silsesquioxane having a phenol unit and a condensed polycyclic hydrocarbon radical (e.g., Patent Document 2) have been proposed. However, photosensitive resin compositions or polymers disclosed in these documents have a problem that the transparency is insufficient due to coloring of polyamide acid or the phenolic hydroxyl group.

As materials containing a siloxane compound excellent in transparency, a photosensitive siloxane composition containing a polysiloxane, a quinone diazide compound, a solvent and a thermally crosslinkable compound (e.g., Patent Document 3), and a high refractive index material containing a siloxane compound having an aromatic hydrocarbon group (e.g., Patent Document 4) have been proposed, but in recent years, a material capable of forming a cured film with a higher refractive index is required.

As siloxane-based materials having a high refractive index, a siloxane-based resin composition obtained by a method of hydrolyzing and condensing an alkoxysilane in the presence of metal compound particles (e.g., Patent Document 5) has been disclosed. However, since such a resin composition has insufficient sensitivity at the time of exposure and produces a minute residue of portion remaining undissolved in development, the resolution is insufficient.

PRIOR ART DOCUMENTS

Patent Documents

Patent Document 1: JP2003-75997A
Patent Document 2: JP2006-312717A
Patent Document 3: JP2006-293337A
Patent Document 4: JP2008-24832A
Patent Document 5: JP2007-246877A

SUMMARY OF THE INVENTION

Problems to be Solved by the Invention

It is an object of the present invention to provide a positive photosensitive resin composition having excellent sensitivity and resolution without deteriorating high refractive index and high transparency.

Means for Solving the Problems

In order to solve the above-mentioned problems, the present invention has the following constitution. That is, the present invention pertains to a positive photosensitive resin composition containing (a) a polysiloxane synthesized by hydrolyzing and partially condensing an organosilane represented by the following general formula (1) and an organosilane oligomer, (b) aluminum compound particles, tin compound particles, titanium compound particles, zirconium compound particles, complex particles of the compounds or complex particles of any of the compounds and a silicon compound, (c) a naphthoquinonediazide compound and (d) a solvent, wherein the organosilane oligomer contains an organosilane represented by the following general formula (2). The present invention also pertains to a positive photosensitive resin composition containing (a') a polysiloxane containing metal compound particles synthesized by hydrolyzing and partially condensing an organosilane represented by the following general formula (1) and an organosilane oligomer in the presence of aluminum compound particles, tin compound particles, titanium compound particles, zirconium compound particles, complex particles of the compounds or complex particles of any of the compounds and a silicon compound, (c) a naphthoquinonediazide compound and (d) a solvent, wherein the organosilane oligomer contains an organosilane represented by the following general formula (2).

[Chem. 1]

(1)

In the above general formula (1), $R^1$ represents hydrogen, an alkyl group having 1 to 10 carbon atoms, an alkenyl group having 2 to 10 carbon atoms or an aryl group having 6 to 16 carbon atoms. $R^2$ represents hydrogen, an alkyl group having 1 to 6 carbon atoms, an acyl group having 2 to 6 carbon atoms or an aryl group having 6 to 16 carbon atoms. n represents an integer of 0 to 3. When n is 2 or more, plural $R^1$s may be the same or different. When n is 2 or less, plural $R^2$s may be the same or different.

[Chem. 2]

(2)

In the above general formula (2), $R^3$ to $R^6$ each independently represent hydrogen, an alkyl group having 1 to 6 carbon atoms, an acyl group having 2 to 6 carbon atoms or an aryl group having 6 to 16 carbon atoms. m represents a numerical value of 2 to 8. When m is 2 or more, plural $R^4$s and $R^5$s may each be the same or different.

Effects of the Invention

In accordance with the present invention, it is possible to provide a positive photosensitive resin composition which has high sensitivity and high resolution and can achieve a cured film with high refractive index and high transparency.

MODES FOR CARRYING OUT THE INVENTION

A first aspect of the positive photosensitive resin composition of the present invention contains (a) a polysiloxane synthesized by hydrolyzing and partially condensing an organosilane represented by the following general formula (1) and an organosilane oligomer, (b) aluminum compound particles, tin compound particles, titanium compound particles, zirconium compound particles, complex particles of the compounds or complex particles of any of the compounds and a silicon compound, (c) a naphthoquinonediazide compound and (d) a solvent, wherein the organosilane oligomer contains an organosilane represented by the general formula (2). Further, a second aspect of the positive photosensitive resin composition of the present invention contains (a') a polysiloxane containing metal compound particles synthesized by hydrolyzing and partially condensing an organosilane represented by the following general formula (1) and an organosilane oligomer in the presence of aluminum compound particles, tin compound particles, titanium compound particles, zirconium compound particles, complex particles of the compounds or complex particles of any of the compounds and a silicon compound, (c) a naphthoquinonediazide compound and (d) a solvent, wherein the organosilane oligomer contains an organosilane represented by the general formula (2).

[Chem. 3]

(1)

In the above general formula (1), $R^1$ represents hydrogen, an alkyl group having 1 to 10 carbon atoms, an alkenyl group having 2 to 10 carbon atoms or an aryl group having 6 to 16 carbon atoms. $R^2$ represents hydrogen, an alkyl group having 1 to 6 carbon atoms, an acyl group having 2 to 6 carbon atoms or an aryl group having 6 to 16 carbon atoms. n represents an integer of 0 to 3. When n is 2 or more, plural $R^1$s may be the same or different. When n is 2 or less, plural $R^2$s may be the same or different.

[Chem. 4]

(2)

In the above general formula (2), $R^3$ to $R^6$ each independently represent hydrogen, an alkyl group having 1 to 6 carbon atoms, an acyl group having 2 to 6 carbon atoms or an aryl group having 6 to 16 carbon atoms. m represents a numerical value of 2 to 8. When m is 2 or more, plural $R^4$s and $R^5$s may each be the same or different.

First, (a) the polysiloxane synthesized by hydrolyzing and partially condensing an organosilane represented by the general formula (1) and an organosilane oligomer will be described. Herein, the organosilane oligomer contains an organosilane represented by the general formula (2).

In the general formula (1), $R^1$ represents hydrogen, an alkyl group having 1 to 10 carbon atoms, an alkenyl group having 2 to 10 carbon atoms or an aryl group having 6 to 16 carbon atoms, and when n is 2 or more, plural $R^1$s may be the same or different. Further, $R^2$ represents hydrogen, an alkyl group having 1 to 6 carbon atoms, an acyl group having 2 to 6 carbon atoms or an aryl group having 6 to 16 carbon atoms, and when n is 2 or less, plural $R^2$s may be the same or different.

Any of the alkyl group, the alkenyl group, the aryl group and the acyl group may be substituted, and specific examples of a substituent include a hydroxy group, an alkoxy group, an epoxy group, an oxetanyl group, a fluoro group, an amino group, a mercapto group, an isocyanate group, an acryloxy group, a methacryloxy group and a carboxy group. Herein, the number of carbon atoms of the alkyl group, the alkenyl group, the aryl group and the acyl group does not include the number of carbon atoms contained in the substituent. Specific examples of the alkyl group and a substituted product thereof include a methyl group, an ethyl group, an n-propyl group, an isopropyl group, an n-butyl group, a t-butyl group, an n-hexyl group, an n-decyl group, a trifluoromethyl group, a 3,3,3-trifluoropropyl group, a 3-glycidoxypropyl group, a 2-(3,4-epoxycyclohexyl)ethyl group, a [(3-ethyl-3-oxetanyl)methoxy]propyl group, a 3-aminopropyl group, a 3-mercaptopropyl group and a 3-isocyanatepropyl group. Specific examples of the alkenyl group and a substituted product thereof include a vinyl group. Specific examples of the aryl group and a substituted product thereof include a phenyl group, a tolyl group, a p-hydroxyphenyl group, and a naphthyl group, a phenanthrenyl group, a fluorenyl group, a pyrenyl group, an indenyl group and an acenaphthenyl group which are condensed polycyclic aromatic hydrocarbon radicals. Specific examples of the acyl group and a substituted product thereof include an acetyl group.

$R^1$ in the general formula (1) preferably contains an aryl group having 6 to 16 carbon atoms from the viewpoint of further improving the compatibility with (c) the naphthoquinonediazide compound described later. Moreover, in (a) the polysiloxane, the content of Si atoms bound to $R^1$, which is an aryl group, is preferably 30 mol % or more, and more preferably 40 mol % or more of the total content of Si atoms originated from the organosilane. By containing the Si atoms bound to $R^1$, which is an aryl group, in an amount of 30 mol % or more, it is possible to inhibit phase separation between (a) the polysiloxane and (c) the naphthoquinonediazide compound in the steps of application, drying and thermal curing during cured film formation to form a uniform cured film with ease.

It is more preferred from the viewpoint of further improving the refractive index of the cured film and the sensitivity and resolution that part of or all of the aryl groups are condensed polycyclic aromatic hydrocarbon radicals. When the condensed polycyclic aromatic hydrocarbon radicals with a high π-electron density are contained, the cured film can be provided with a high refractive index. Further, since the condensed polycyclic aromatic hydrocarbon radicals exert an effect of inhibiting dissolution of an unexposed area in development by the interaction with naphthoquinonediazide, the contrast between the exposed area and the unexposed area becomes larger. Thereby, the sensibility can be further improved, and moreover, a reduction in resolution due to a minute residue of portion remaining undissolved can be inhibited. As the condensed polycyclic aromatic hydrocarbon radical, a naphthyl group is preferred. Moreover, in (a) the polysiloxane, the content of Si atoms bound to $R^1$, which is a condensed polycyclic aromatic hydrocarbon radical, is preferably 10 mol % or more of the total content of Si atoms originated from the organosilane. By containing Si atoms bound to $R^1$ in an amount of 10 mol % or more, the sensitivity and resolution of the positive photosensitive resin composition can be further improved and the refractive index of the cured film can be further improved. On the other hand, the content of Si atoms bound to $R^1$ is preferably 60 mol % or less, and more preferably 50 mol % or less from the viewpoint of suppressing a minute residue of portion remaining undissolved in development and further improving the resolution of the positive photosensitive resin composition.

The content of Si atoms bound to $R^1$, which is a condensed polycyclic aromatic hydrocarbon radical, can be determined by measuring $^{29}$Si-NMR spectrum of a polysiloxane and calculating the ratio between the resulting peak areas of Si bound to a condensed polycyclic aromatic hydrocarbon radical and Si not bound to a condensed polycyclic aromatic hydrocarbon radical.

In the general formula (1), n represents an integer of 0 to 3. When n is 0, the organosilane is a tetrafunctional silane. When n is 1, the organosilane is a trifunctional silane. When n is 2, the organosilane is a bifunctional silane. When n is 3, the organosilane is a monofunctional silane.

Specific examples of the organosilane represented by the general formula (1) include tetrafunctional silanes such as tetramethoxysilane, tetraethoxysilane, tetraacetoxysilane and tetraphenoxysilane; trifunctional silanes such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, 3-(trimethoxysilyl)propyl succinate, 1-naphthyltrimethoxysilane, 1-naphthyltriethoxysilane, 1-naphthyltri-n-propoxysilane, 2-naphthyltrimethoxysilane, 1-anthracenyltrimethoxysilane, 9-anthracenyltrimethoxysilane, 9-phenanthrenyltrimethoxysilane, 9-fluorenyltrimethoxysilane, 2-fluorenyltrimethoxysilane, 1-pyrenyltrimethoxysilane, 2-indenyltrimethoxysilane and 5-acenaphthenyltrimethoxysilane; bifunctional silanes such as dimethyldimethoxysilane, dimethyldiethoxysilane, dimethyldiacetoxysilane, di-n-butyldimethoxysilane, diphenyldimethoxysilane, (3-glycidoxypropyl)methyldimethoxysilane, (3-glycidoxypropyl)methyldiethoxysilane, di(1-naphthyl)dimethoxysilane and di(1-naphthyl)diethoxysilane;andmonofunctional silanes such as trimethylmethoxysilane, tri-n-butylethoxysilane, (3-glycidoxypropyl)dimethylmethoxysilane and (3-glycidoxypropyl)dimethylethoxysilane. Two or more of these organosilanes may be used in combination. Among these organosilanes, a trifunctional silane is preferably used from the viewpoint of improving the hydrolyzability and condensation reactivity at the time of polysiloxane synthesis to further improve the crack resistance and hardness of the cured film.

Further, 1-naphthyltrimethoxysilane, 1-naphthyltriethoxysilane, 1-naphthyltri-n-propoxysilane, 2-naphthyltrimethoxysilane, 1-anthracenyltrimethoxysilane, 9-anthracenyltrimethoxysilane, 9-phenanthrenyltrimethoxysilane, 9-fluorenyltrimethoxysilane, 2-fluorenyltrimethoxysilane, 2-fluorenonyl trimethoxysilane, 1-pyrenyltrimethoxysilane, 2-indenyltrimethoxysilane and 5-acenaphthenyltrimethoxysilane, in which each of $R^1$s is a condensed polycyclic aromatic hydrocarbon radical, are preferred.

In the general formula (2), $R^3$ to $R^6$ each independently represent hydrogen, an alkyl group having 1 to 6 carbon atoms, an acyl group having 2 to 6 carbon atoms or an aryl group having 6 to 16 carbon atoms, and plural $R^4$s and $R^5$s may each be the same or different. Any of the alkyl group, the acyl group and the aryl group may be substituted, and specific examples of a substituent include groups mentioned as the specific examples of substituents of $R^2$. Specific examples of the alkyl group, the acyl group, the aryl group and substitution products thereof include groups mentioned as the specific examples of $R^2$. Among these groups, the alkyl group having 1 to 6 carbon atoms is preferred. By using an organosilane represented by the general formula (2), a positive photosensitive resin composition having excellent sensitivity and resolution can be obtained while maintaining high transparency.

The positive photosensitive resin composition of the present invention develops solubility in an alkali by a silanol group produced by the hydrolysis of an organosilane. Since the silanol group disappears by condensation, with the progress of condensation, conventionally known polysiloxanes may become poorly-soluble in an alkali, resulting in a reduction of sensitivity or a reduction of resolution due to a minute residue of portion remaining undissolved. On the other hand, when the condensation is insufficient, the glass transition point of the polysiloxane may be lowered, and therefore pattern reflow may occur during curing to deteriorate the resolution. In the present invention, a large amount of silanol groups are produced by using an organosilane represented by the general formula (2) and carrying out hydrolysis. Thereby, silanol groups remain in an amount large enough for the positive photosensitive resin composition to be dissolved in an alkali even in a state of a polysiloxane having a high glass transition point whose condensation has been progressed. For this reason, it is conceived that the high sensitivity and resolution can be achieved. Further, by using an organosilane represented by the general formula (2), the silanol groups are located at positions close to one another, and therefore the interaction with (c) the naphthoquinonediazide compound described later is enhanced. Thereby, the contrast between the exposed area and the unexposed area becomes large, and thereby, the sensibility can be further improved, and moreover, a reduction in resolution due to a minute residue of portion remaining undissolved can be inhibited.

Specific examples of the organosilane represented by the general formula (2) include Methyl silicate 51 ($R^3$ to $R^6$: methyl group, m: 4 on average) manufactured by Fuso Chemical Co., Ltd., M silicate 51 ($R^3$ to $R^6$: methyl group, m: 3 to 5 on average), Silicate 40 ($R^3$ to $R^6$: ethyl group, m: 4 to 6 on average) and Silicate 45 ($R^3$ to $R^6$: ethyl group, m: 6 to 8 on average) manufactured by TAMA CHEMICALS CO., LTD., and Methyl silicate 51 ($R^3$ to $R^6$: methyl group, m: 4 on average), Methyl silicate 53A ($R^3$ to $R^6$: methyl group, m: 7 on average) and Ethyl silicate 40 ($R^3$ to $R^6$: ethyl group, m: 5 on average) manufactured by COLCOAT CO., Ltd. Two or more of these organosilanes may be used in combination.

The content of Si atoms originated from the organosilane represented by the general formula (2) in the organosilane oligomer in (a) the polysiloxane is preferably 67 mol or more and 100 mol % or less of the total content of Si atoms originated from the organosilane oligomer in (a) the polysiloxane. When Si atoms originated from the organosilane represented by the general formula (2) are contained in an amount of 67 mol or more, the sensitivity and resolution of the resulting positive photosensitive resin composition can be further improved. The content of the Si atoms is more preferably 80 mol % or more, and most preferably 100 mol %. That is, (a) the polysiloxane, which is synthesized by hydrolyzing and partially condensing an organosilane represented by the general formula (1) and an organosilane represented by the general formula (2), is most preferred. When the Si atoms originated from the organosilane represented by the general formula (2) are contained in an amount of 100 mol % or less, production of a gel-like substance can be inhibited in synthesizing a polysiloxane, and therefore coatability of the resulting positive photosensitive resin composition can be improved.

The content of Si atoms originated from the organosilane represented by the general formula (2) in (a) the polysiloxane is preferably 5 mol % or more and 50 mol % or less of the total content of Si atoms originated from an organosilane. When Si atoms originated from the organosilane represented by the general formula (2) are contained in an amount of 5 mol % or more, the sensitivity and resolution of the resulting positive photosensitive resin composition can be further improved. The content of the Si atoms is more preferably 10 mol % or more. When the Si atoms originated from the organosilane represented by the general formula (2) are contained in an amount of 50 mol % or less, production of a gel-like substance can be inhibited in synthesizing a polysiloxane, and therefore coatability of the resulting positive photosensitive resin composition can be improved.

The content of Si atoms originated from the organosilane represented by the general formula (2) in (a) the polysiloxane can be determined by determining the structure of an organosilane raw material by $^1$H-NMR, $^{13}$C-NMR, $^{29}$Si-NMR, IR, TOF-MS or the like, and calculating the content from the ratio of an integral value of a peak originated from Si—C bonds to an integral value of a peak originated from Si—O bonds in an IR spectrum.

The weight-average molecular weight (Mw) of (a) the polysiloxane is not particularly limited, but it is preferred that the molecular weight on the polystyrene equivalent basis measured by GPC (gel permeation chromatography) is 1000 or more since coatability is improved. On the other hand, the weight-average molecular weight is preferably 100000 or less, and more preferably 50000 or less from the viewpoint of the solubility in a developer.

(a) the polysiloxane in the present invention is synthesized by hydrolyzing and partially condensing an organosilane represented by the general formula (1) and an organosilane oligomer. Herein, the organosilane oligomer contains an organosilane represented by the general formula (2). Herein, partial condensation refers to leave part of Si—OH, which is a hydrolysate, in the resulting polysiloxane without condensing all of the Si—OH. If common condensation conditions described later are employed, in general, the Si—OH is partially left, and in the present invention, the amount of the left Si—OH is not limited. In addition to the organosilanes represented by the general formulas (1) and (2), still other organosilanes may be used. For the hydrolysis and partial condensation, a common method can be used. For example, there is a method in which a solvent, water and, as required, a catalyst are added to the mixture of organosilanes, and the resulting mixture is heated and stirred at 50 to 150° C. for about 0.5 to about 100 hours. During stirring, as required, hydrolysis byproducts (alcohols such as methanol) and condensation byproducts (water) may also be distilled off by distillation.

The solvent is not particularly limited, but usually (d) a solvent described later is used. The addition amount of the solvent is preferably from 10 to 1000 parts by weight relative to 100 parts by weight of the organosilane. Further, the addition amount of water used for a hydrolysis reaction is preferably from 0.5 to 2 mol per 1 mol of hydrolyzable groups.

The catalyst is not particularly limited, and an acid catalyst or a base catalyst is preferably used. Specific examples of the acid catalyst include hydrochloric acid, nitric acid, sulfuric acid, hydrofluoric acid, phosphoric acid, acetic acid, trifluoroacetic acid, formic acid, polycarboxylic acids and anhydrides thereof, and ion exchange resins. Specific examples of the base catalyst include triethylamine, tripropylamine, tributylamine, tripentylamine, trihexylamine, triheptylamine, trioctylamine, diethylamine, triethanolamine, diethanolamine, sodium hydroxide, potassium hydroxide, alkoxysilanes having an amino group and ion exchange resins. The addition amount of the catalyst is preferably from 0.01 to 10 parts by weight relative to 100 parts by weight of the organosilane.

Furthermore, from the viewpoint of the storage stability of the positive photosensitive resin composition, it is preferred that the polysiloxane solution obtained after hydrolysis and partial condensation does not contain the catalyst, and the catalyst can be removed as required. The method for removing the catalyst is not particularly limited, but washing with water and/or a treatment using an ion exchange resin is preferred from the viewpoint of ease of operation and removal performance. Washing with water is a method in which the polysiloxane solution is diluted with an appropriate hydrophobic solvent and is washed with water several times, and the resulting organic layer is concentrated using an evaporator or the like. The treatment using an ion exchange resin refers to a method in which the polysiloxane solution is brought into contact with an appropriate ion exchange resin.

The positive photosensitive resin composition of the present invention contains (b) aluminum compound particles, tin compound particles, titanium compound particles, zirconium compound particles, complex particles of the compounds or complex particles of any of the compounds and a silicon compound (hereinafter, may be referred to as metal compound particles). Examples of the metal compound particles include particles of metal compounds such as oxides, sulfides and hydroxides of aluminum, tin, titanium and zirconium, and complex particles of any of these metal compounds and a silicon compound. Examples of the complex particles of any of these metal compounds and a silicon compound include silicon oxide-metal compound complex particles in which metal particles are synthesized in the presence of a silicon oxide compound, and metal compound particles whose surface is covered with silane formed by reacting metal particles with a silane coupling agent. The positive photosensitive resin composition of the present invention may contain two or more of these particles. When the abovementioned metal compound particles are contained, the cured film can be provided with a high refractive index.

Specific examples of (b) the metal compound particles include "OPTOLAKE (registered trademark)" TR-502 and "OPTOLAKE" TR-504, which are tin oxide-titanium oxide complex particles, "OPTOLAKE" TR-503, "OPTOLAKE" TR-513, "OPTOLAKE"

TR-520, "OPTOLAKE" TR-527, "OPTOLAKE" TR-528, "OPTOLAKE" TR-529, "OPTOLAKE" TR-543 and "OPTOLAKE" TR-544, which are silicon oxide-titanium oxide complex particles, and "OPTOLAKE" TR-505 which is titanium oxide particles (trade names, manufactured by JGC Catalysts and Chemicals Ltd.), zirconium oxide particles (manufactured by Kojundo Chemical Laboratory Co., Ltd.), tin oxide-zirconium oxide complex particles (manufactured by JGC Catalysts and Chemicals Ltd.), and tin oxide particles (manufactured by Kojundo Chemical Laboratory Co., Ltd.).

The number average particle size of (b) the metal compound particles is preferably 1 nm or more from the viewpoint of inhibiting cracks to be produced in forming a thick film. The number average particle size is preferably 200 nm or less, and more preferably 70 nm or less from the viewpoint of further improving the transparency of a cured film to visible light. Herein, the number average particle size of the metal compound particles can be measured by a gas adsorption method, a dynamic light scattering method, an X-ray small angle scattering method, a method of directly measuring the particle size using a transmission electron microscope or a scanning electron microscope, or the like.

The content of (b) the metal compound particles in the positive photosensitive resin composition of the present invention is preferably 10 parts by weight or more, and more preferably 25 parts by weight or more relative to 100 parts by weight of the polysiloxane in the component (a). Further, the content of (b) the metal compound particles is preferably 250 parts by weight or less, and more preferably 200 parts by weight or less. When the content is within this range, the transmittance and refractive index of a cured film can be further improved while maintaining the high sensitivity and resolution of the positive photosensitive resin composition.

Next, (a') the polysiloxane containing metal compound particles, which is synthesized by hydrolyzing and partially condensing an organosilane represented by the general formula (1) and an organosilane oligomer in the presence of aluminum compound particles, tin compound particles, titanium compound particles, zirconium compound particles, complex particles of the compounds or complex particles of any of the compounds and a silicon compound, will be described. Herein, the organosilane oligomer contains an organosilane represented by the general formula (2).

By using (a') the polysiloxane containing metal compound particles, a positive photosensitive resin composition extremely excellent in dispersion stability can be attained. It is thought that the excellent dispersion stability is obtained since the polysiloxane of a matrix is bound to metal compound particles. This bound state can be seen by observing the boundary portion between the metal compound particles and the polysiloxane with a scanning electron microscope or a transmission electron microscope. If the polysiloxane is bound to metal compound particles, the interface between them is unclear.

The metal compound particles used for (a') the polysiloxane containing metal compound particles are the same as those exemplified as the component (b). Further, the organosilane represented by the general formula (1) or (2) is the same as the organosilanes exemplified for the polysiloxane in the component (a). Herein, the content of the Si atoms originated from the organosilane represented by the general formula (2) in the organosilane oligomer is preferably 67 mol % or more and 100 mol % or less of the total content of Si atoms originated from the organosilane oligomer. When the Si atoms originated from the organosilane represented by the general formula (2) are contained in an amount of 67 mol % or more, the sensitivity and resolution of the resulting positive photosensitive resin composition can be further improved. The content of the Si atoms is more preferably 80 mol % or more, and most preferably 100 mol %. That is, (a') the polysiloxane containing metal compound particles, which is synthesized by hydrolyzing and partially condensing an organosilane represented by the general formula (1) and an organosilane represented by the general formula (2) in the presence of aluminum compound particles, tin compound particles, titanium compound particles, zirconium compound particles, complex particles of the compounds or complex particles of any of the compounds and a silicon compound, is most preferred. When the Si atoms originated from the organosilane represented by the general formula (2) are contained in an amount of 100 mol % or less, production of a gel-like substance can be inhibited in synthesizing a polysiloxane, and therefore coatability of the resulting positive photosensitive resin composition can be improved. Herein, the content of Si atoms originated from the organosilane represented by the general formula (2) in (a') the polysiloxane containing metal compound particles is preferably 5 mol % or more and 50 mol % or less of the total content of the Si atoms originated from the organosilane in the polysiloxane containing metal compound particles. When the Si atoms originated from the organosilane represented by the general formula (2) are contained in an amount of 5 mol % or more, the sensitivity and resolution of the resulting positive photosensitive resin composition can be further improved. The content of the Si atoms is more preferably 10 mol % or more. When the Si atoms originated from the organosilane represented by the general formula (2) are contained in an amount of 50 mol % or less, production of a gel-like substance can be inhibited in synthesizing a polysiloxane, and therefore coatability of the resulting positive photosensitive resin composition can be improved. The content of Si atoms originated from the organosilane represented by the general formula (2) in (a') the polysiloxane containing metal compound particles can be determined in the same manner as in the polysiloxane in the component (a).

In (a') the polysiloxane containing metal compound particles, n in the general formula (1) is preferably 1, and moreover, the content of Si atoms bound to $R^1$, which is a condensed polycyclic aromatic hydrocarbon radical, is preferably 10 mol % or more of the total content of Si atoms originated from the organosilane. By containing Si atoms bound to $R^1$, which is a condensed polycyclic aromatic hydrocarbon radical, in an amount of 10 mol % or more, the sensitivity and resolution of the positive photosensitive resin composition can be further improved and the refractive index of the cured film can be further improved. On the other hand, the content of Si atoms bound to $R^1$, which is a condensed polycyclic aromatic hydrocarbon radical, is preferably 60 mol % or less, and more preferably 50 mol % or less from the viewpoint of suppressing a minute residue of portion remaining undissolved in development and further improving the resolution of the positive photosensitive resin composition. The content of Si atoms bound to $R^1$, which is a condensed polycyclic aromatic hydrocarbon radical, can be determined in the same manner as in the polysiloxane in the component (a).

(a') the polysiloxane containing metal compound particles in the present invention is synthesized by hydrolyzing and partially condensing the above-mentioned organosilanes in the presence of the above-mentioned metal compound particles. Preferred reaction conditions in the hydrolysis and partial condensation are the same as those in the polysiloxane in the component (a).

The positive photosensitive resin composition of the present invention contains (c) a naphthoquinonediazide compound. By containing (c) the naphthoquinonediazide compound, the resin composition exhibits the positive photosensitivity to the extent that an exposed area is removed with a developer. As the naphthoquinonediazide compound, a compound having naphthoquinonediazide sulfonic acid ester-bonded to a compound having a phenolic hydroxyl group is preferred.

Specific examples of the compound having a phenolic hydroxyl group include the following compounds (all of them are manufactured by Honshu Chemical Industry Co., Ltd.).

[Chem. 5]

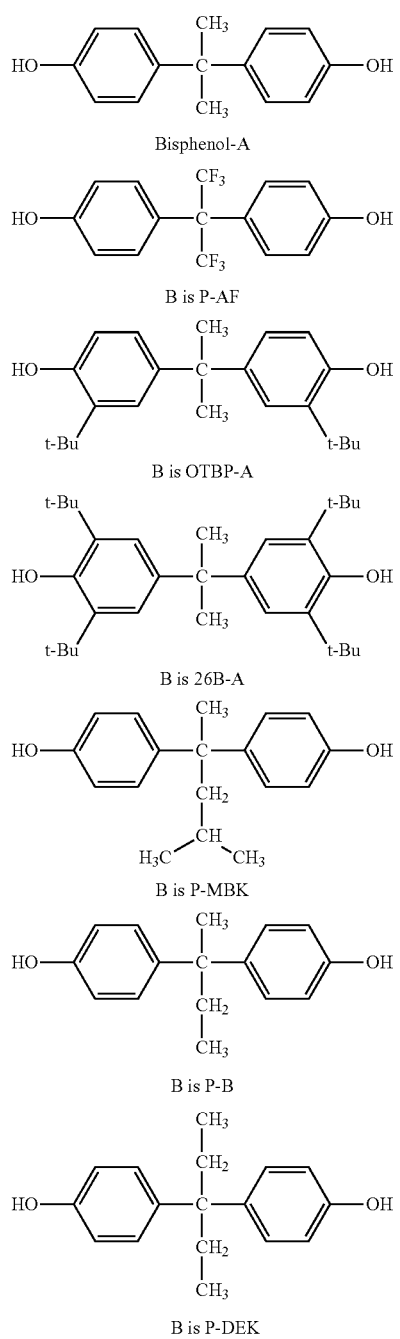

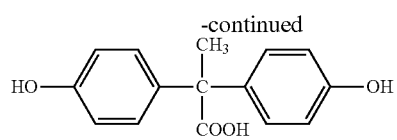
B is P-PR

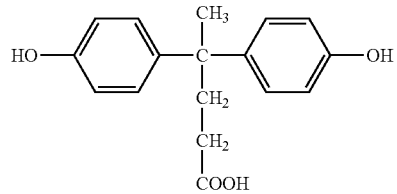
B is P-LV

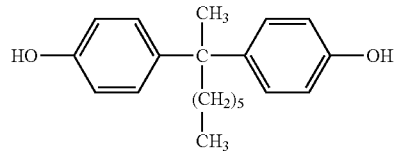
B is P-OT

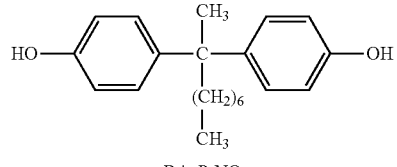
B is P-NO

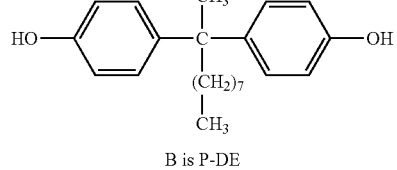
B is P-DE

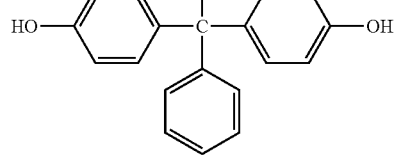
B is P-AP

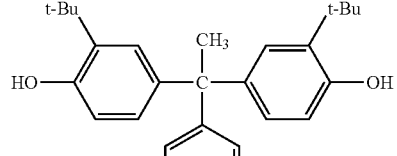
B is OTBP-AP

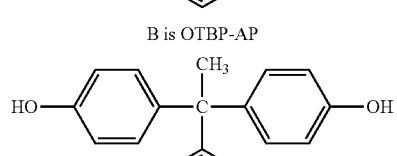
TrisP-HAP

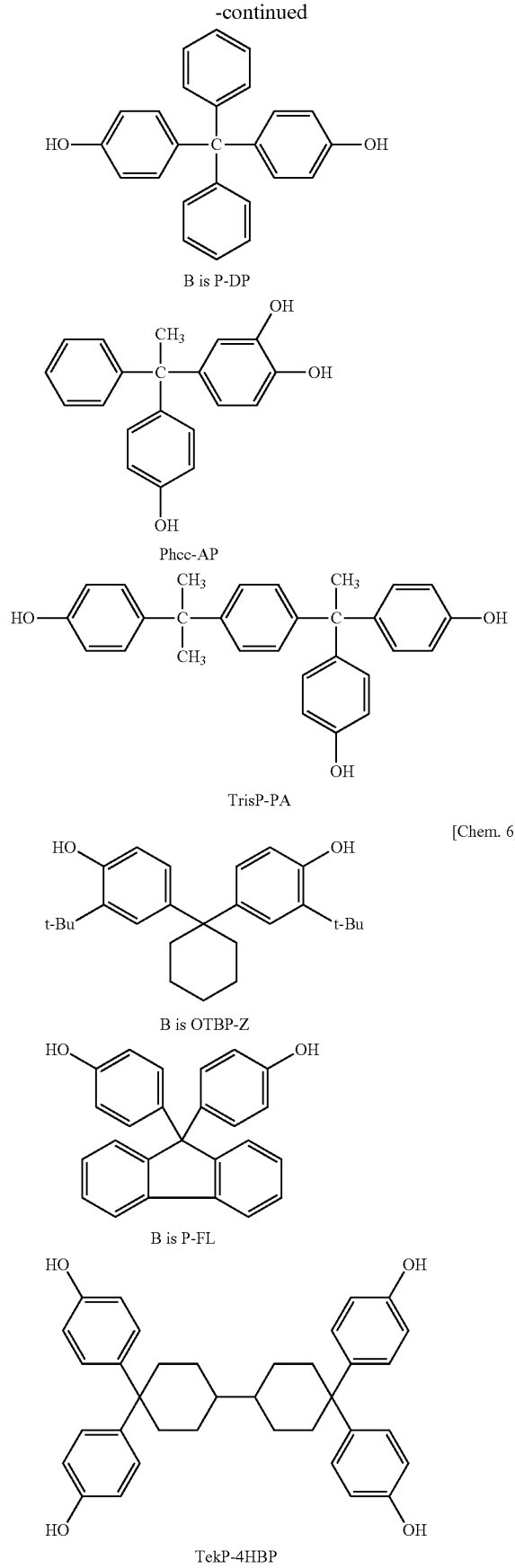

The naphthoquinonediazide compound can be synthesized by a conventionally known esterification reaction between a compound having a phenolic hydroxyl group and naphthoquinonediazide sulfonic acid chloride. As the naphthoquinonediazide sulfonic acid chloride to be used as a raw material, 4-naphthoquinonediazide sulfonic acid chloride or 5-naphthoquinonediazide sulfonic acid chloride can be used. A 4-naphthoquinonediazide sulfonic ester compound is suitable for i-line exposure since it has an absorption band in an i-line (wavelength 365 nm) region. Furthermore, a 5-naphthoquinonediazide sulfonic ester compound is suitable for exposure in a wide range of wavelengths since it has an absorption band in a wide range of wavelength region. It is preferred to select a 4-naphthoquinonediazide sulfonic ester compound or a 5-naphthoquinonediazide sulfonic ester compound in accordance with the wavelength used for exposure. A 4-naphthoquinonediazide sulfonic ester compound and a 5-naphthoquinonediazide sulfonic ester compound can be used in combination.

The content of (c) the naphthoquinonediazide compound in the positive photosensitive resin composition of the present invention is not particularly limited, and is preferably 1 part by weight or more, and more preferably 3 parts by weight or more relative to 100 parts by weight of (a) the polysiloxane or (a') the polysiloxane containing metal compound particles. Further, the content is preferably 30 parts by weight or less, and more preferably 20 parts by weight or less from the viewpoint of suppressing a reduction in compatibility with a polysiloxane or coloring due to decomposition in thermal curing, and further improving the transparency of the positive photosensitive resin composition or cured film.

The positive photosensitive resin composition of the present invention contains (d) a solvent. The solvent is not particularly limited, but a compound having an alcoholic hydroxyl group is preferred. When the solvent having an alcoholic hydroxyl group is used, the solubility of (a) the polysiloxane or (a') the polysiloxane containing metal compound particles and (c) the quinone diazide compound can be improved, and the transparency of a coating film prepared from the positive photosensitive resin composition can be further improved.

The solvent having an alcoholic hydroxyl group is not particularly limited, but a compound having a boiling point of 110 to 250° C. at atmospheric pressure is preferred. When the boiling point of the solvent is 110° C. or higher, drying in forming the coating film proceeds moderately and a coating film having good surface appearance can be easily attained. On the other hand, when the boiling point of the solvent is 250° C. or lower, the solvent remaining in the film can be easily removed.

Specific examples of the solvent having an alcoholic hydroxyl group include acetol (boiling point: 147° C.), 3-hydroxy-3-methyl-2-butanone (boiling point: 140° C.), 4-hydroxy-3-methyl-2-butanone (boiling point: 73° C.), 5-hydroxy-2-pentanone (boiling point: 144° C.), 4-hydroxy-4-methyl-2-pentanone (diacetone alcohol) (boiling point: 166° C.), ethyl lactate (boiling point: 151° C.), butyl lactate (boiling point: 186° C.), propylene glycol monomethyl ether (boiling point: 118° C.), propylene glycol monoethyl ether (boiling point: 132° C.), propylene glycol mono-n-propyl ether (boiling point: about 150° C.), propylene glycol mono-n-butyl ether (boiling point: 170° C.), diethylene glycol monomethyl ether (boiling point: 194° C.), diethylene glycol monoethyl ether (boiling point: 202° C.), dipropylene glycol monomethyl ether (boiling point: about 190° C.), 3-methoxy-1-butanol (boiling point: 161° C.) and 3-methyl-3-methoxy-1-butanol (boiling point: 174° C.). The positive photosensitive resin composition of the present invention may contain two or more of these solvents.

Further, the positive photosensitive resin composition of the present invention may contain other solvents together with the above-mentioned solvents or in addition to the above-mentioned solvents. Examples of the other solvents include esters such as ethyl acetate, n-propyl acetate, isopropyl lactate, n-butyl acetate, isobutyl acetate, propylene glycol monomethyl ether acetate, 3-methoxy-1-butyl acetate, 3-methyl-3-methoxy-1-butyl acetate and ethyl acetoacetate; ketones such as methyl isobutyl ketone, diisopropyl ketone, diisobutyl ketone and acetylacetone; ethers such as diethyl ether, diisopropyl ether, di-n-butyl ether, diphenyl ether, diethylene glycol ethylmethyl ether and diethylene glycol dimethyl ether; γ-butyrolactone, γ-valerolactone, δ-valerolactone, propylene carbonate, N-methylpyrrolidone, cyclopentanone, cyclohexanone, and cycloheptanone.

The content of (d) the solvent in the positive photosensitive resin composition of the present invention is not particularly limited, and is preferably 100 to 2000 parts by weight relative to 100 parts by weight of (a) the polysiloxane or (a') the polysiloxane containing metal compound particles.

Moreover, the positive photosensitive resin composition of the present invention, as required, may contain additives such as a silane coupling agent, a crosslinking agent, a crosslinking promoter, a sensitizer, a thermal radical generator, a dissolution promoter, a dissolution inhibitor, a surfactant, a stabilizer and an antifoaming agent.

Next, a method of curing the positive photosensitive resin composition of the present invention to obtain a cured film will be described by way of examples.

The positive photosensitive resin composition of the present invention is applied onto a substrate by a conventionally known method such as spin coating or slit coating and heated (prebaked) using a heating apparatus such as a hot plate or an oven. Prebaking is preferably carried out in a temperature range from 50 to 150° C. for 30 seconds to 30 minutes. A prebaked film preferably has a thickness of 0.1 to 15 μm.

After completion of prebaking, an ultraviolet-visible exposure machine such as a stepper, a mirror projection mask aligner (MPA) or a parallel light mask aligner (PLA) is used for pattern exposure through a desired mask at about 10 to about 4000 J/m$^2$ (in terms of the exposure amount at a wavelength of 365 nm).

After completion of exposure, the exposed area is dissolved and removed by development to obtain a positive pattern. The resolution of the pattern is preferably 8 μm or less. As the developing method, it is preferred to immerse the substrate in a developer for 5 seconds to 10 minutes by a method such as showering, dipping or paddling. As the developer, a conventionally known alkaline developer can be used. Examples of the alkaline developer include aqueous solutions of inorganic alkalis such as alkali metal hydroxides, carbonates, phosphates, silicates and borates; amines such as 2-diethylaminoethanol, monoethanolamine and diethanolamine; and quaternary ammonium salts such as tetramethylammonium hydroxide (TMAH) and choline. Two or more of these maybe used in combination. After completion of development, it is preferred to rinse the substrate using water, and if necessary, a heating apparatus such as a hot plate or an oven can be used for baking with dewatering and drying in a temperature range from 50 to 150° C.

Thereafter, the ultraviolet-visible exposure machine such as a PLA is used to expose (bleaching exposure) the entire film surface to light at about 100 to 20000 J/m$^2$ (in terms of the exposure amount at a wavelength of 365 nm). When bleaching exposure is performed, an unreacted naphthoquinonediazide compound remaining in the developed film can be photo-decomposed to further improve the transparency of the resulting cured film.

The film subjected to bleaching exposure, if necessary, is heated (soft-baked) in a temperature range from 0 to 250° C. for 30 seconds to 30 minutes using a heating apparatus such as a hot plate or an oven, and is heated (cured) in a temperature range from 150 to 450° C. for about 30 seconds to 2 hours using a heating apparatus such as a hot plate or an oven to form a cured film.

The positive photosensitive resin composition of the present invention preferably has a photosensitivity of 1500 J/m$^2$ or less, and more preferably a photosensitivity of 1000 J/m$^2$ or less at the time of exposure from the viewpoint of productivity in forming a pattern. Such a high sensitivity can be easily achieved, for example, by a positive photosensitive resin composition containing a polysiloxane formed by using an organosilane represented by the general formula (2).

The photosensitivity in exposure can be determined by the following method. The positive photosensitive resin composition is applied onto a silicon wafer by spin coating at an arbitrary rotating speed using a spin coater and then prebaked at 120° C. for 3 minutes by use of a hot plate to prepare a prebaked film with a thickness of 1 μm. The prebaked film is exposed through a gray scale mask having a line and space pattern of 1 to 10 μm for photosensitivity measurement to an ultra high pressure mercury lamp using a PLA (PLA-501F manufactured by Canon Inc.), and developed with a shower of 2.38 wt % aqueous TMAH solution for 60 seconds using an automatic developing machine (AD-2000 manufactured by Takizawa Sangyo Co., Ltd.), and then rinsed with water for 30 seconds. In the formed pattern, the exposure amount at which a 10 µm line and space pattern can be resolved at a width ratio of 1:1 is determined as the photosensitivity.

Further, the positive photosensitive resin composition of the present invention preferably has a resolution after curing of 10 µm or less, and more preferably 5 µm or less for fine hole pattern formation. Such a resolution can be easily achieved, for example, by a positive photosensitive resin composition containing a polysiloxane formed by using an organosilane represented by the general formula (2).

The resolution after curing is determined by the following method. By the same method as that of determining the photosensitivity in exposure described above, the exposure amount at which a 10 µm line and space pattern is resolved at a width ratio of 1:1 is determined as the photosensitivity. Thereafter, a hot plate is used for soft baking at 200° C. for 5 minutes, and then used for curing at 300° C. for 5 minutes to prepare a cured film, and thereby, a minimum pattern size at the sensitivity after curing is determined as the resolution after curing.

A cured film formed by curing the positive photosensitive resin composition of the present invention preferably has a light transmittance per a thickness of 1 µm of 90% or more at a wavelength of 400 nm, and furthermore preferably has a light transmittance of 92% or more. Such a high transmittance can be easily achieved, for example, by a positive photosensitive resin composition using a polysiloxane with high transparency as a resin component.

The transmittance of the cured film per a thickness of 1 µm at a wavelength of 400 nm is determined by the following method. The positive photosensitive resin composition is applied onto a TEMPAX Float glass plate by spin coating at an arbitrary rotating speed using a spin coater and then prebaked at 120° C. for 2 minutes by use of a hot plate. Thereafter, as bleaching exposure, a PLA is used to expose the entire film surface to an ultra high pressure mercury lamp at 5000 J/m$^2$ (in terms of the exposure amount at a wavelength of 365 nm), and then, a hot plate is used for thermally curing the film at 300° C. for 5 minutes in the air to prepare a cured film having a thickness of 1 µm. The absorption spectrum in the ultraviolet and visible region of the obtained cured film is measured using MultiSpec-1500 manufactured by Shimadzu Corp., and the transmittance at a wavelength of 400 nm is determined. As another method, the transmittance can be determined by measuring the extinction coeffect of an objective cured film by each wavelength and the film thickness by using a spectroscopic ellipsometer FE 5000 manufactured by Otsuka Electronics Co., Ltd. and substituting the measurements into the following equation.

Transmittance $= \exp(-4\pi kt/\lambda)$

In the above equation, k represents an extinction coeffect, t represents a film thickness, and $\lambda$ represents a measured wavelength.

The positive photosensitive resin composition and the cured film of the present invention are suitably used for optical devices such as solid state image sensors, optical filters and displays. More specific examples thereof include a collecting microlens and an optical waveguide formed in a solid state image sensor or the like, an anti-reflection film installed as an optical filter, a planarizing material of a TFT substrate for a display, a protective film of a liquid crystal display or a color filter, and a phase shifter. Among these, the positive photosensitive resin composition and the cured film of the present invention are particularly suitably used for a collecting microlens formed on a solid state image sensor and an optical waveguide which connects the collecting microlens to an optical sensor part since they can achieve high transparency and high refractive index simultaneously. The positive photosensitive resin composition and the cured film of the present invention can also be used as a buffer coat, an interlayer insulation film and various protective films of a semiconductor device. In the positive photosensitive resin composition of the present invention, works can be simplified and the degradation of a wiring part due to an etching liquid or plasma can be avoided since pattern formation by an etching process is unnecessary.

EXAMPLES

Hereinafter, the present invention will be described in more detail by way of examples, but the present invention is not limited to these examples. Compounds, for which an abbreviation is used, of the compounds used in synthesis examples and examples are shown below.
PGMEA: propylene glycol monomethyl ether acetate
GBL: γ-butyrolactone
DAA: diacetone alcohol Correspondence between organosilanes used in synthesis examples and the general formula (2) is shown below.
M silicate 51 manufactured by TAMA CHEMICALS CO., LTD.: $R^3$ to $R^6$=methyl group, m=3 to 5 on average
Silicate 40 manufactured by TAMA CHEMICALS CO., LTD.: $R^3$ to $R^6$=ethyl group, m=4 to 6 on average
Silicate 45 manufactured by TAMA CHEMICALS CO., LTD.: $R^3$ to $R^6$=ethyl group, m=6 to 8 on average The solid content concentration of the polysiloxane solution was determined by the following method. 1.5 g of a polysiloxane solution was weighed out in an aluminum cup and heated at 250° C. for 30 minutes by use of a hot plate to evaporate the liquid portion. The solids left in the aluminum cup after heating were weighed out to determine the solid content concentration of the polysiloxane solution.

The content of Si atoms originated from the organosilane represented by the general formula (2) in a polysiloxane or a polysiloxane containing metal compound particles was determined by the following method. Assuming that the used organosilane was completely condensed, an amount of Si—O bonds not containing Si—C bonds was calculated from the ratio of an integral value of a peak originated from Si—C bonds to an integral value of a peak originated from Si—O bonds in an IR spectrum, and thereby the content of Si atoms originated from the organosilane represented by the general formula (2) was determined.

The content of Si atoms bound to $R^1$, which is a condensed polycyclic aromatic hydrocarbon radical, in a polysiloxane or a polysiloxane containing metal compound particles, was determined by measuring $^{29}$Si-NMR spectrum of a polysiloxane or a polysiloxane containing metal compound particles and calculating the ratio between the resulting peak areas of Si bound to a condensed polycyclic aromatic hydrocarbon radical and Si not bound to a condensed polycyclic aromatic hydrocarbon radical.

The weight average molecular weight (Mw) of the resulting trifunctional silane oligomer was measured by use of tetrahydrofuran as a developing solvent using GPC (gel permeation chromatography) HLC-8220 (manufactured by TOSOH Corp.) and the weight average molecular weight (Mw) was calculated on the polystyrene equivalent basis.

Synthesis Example 1

Synthesis of Polysiloxane Solution (PS-1)

Into a 500 mL three-neck flask, 54.48 g (0.40 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane, 5.88 g (equivalent to 0.05 mol of Si atoms) of M silicate 51 (manufactured by TAMA CHEMICALS CO., LTD.) and 155.04 g of PGMEA were charged (initial monomer concentration=52.6 wt %), and an aqueous phosphoric acid solution formed by dissolving 0.515 g (0.30 wt % with respect to the supplied monomers) of phosphoric acid in 54.45 g of water was added over 10 minutes while stirring at room temperature. Then, the flask was immersed in an oil bath of 40° C. while stirring the solution for 60 minutes, and the temperature of the oil bath was raised up to 115° C. over 30 minutes. One hour after the start of temperature rise, the internal temperature of the solution reached 100° C., and the solution was heated and stirred for further 2 hours (the internal temperature of the solution in the duration was 100 to 110° C.) to obtain a polysiloxane solution (PS-1). In addition, a nitrogen gas was flowed at a flow rate of 0.05 1/min during the temperature rise and stirring with heating. During the reaction, 98.42 g in total of methanol and water were distilled out as by-products. The obtained polysiloxane solution (PS-1) had a solid content concentration of 40 wt %. In addition, the content of Si atoms originated from the organosilane represented by the general formula (2) in the polysiloxane was 4.0 mol %.

Synthesis Example 2

Synthesis of Polysiloxane Solution (PS-2)

Into a 500 mL three-neck flask, 40.86 g (0.30 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane, 17.63 g (equivalent to 0.15 mol of Si atoms) of M silicate 51 (manufactured by TAMA CHEMICALS CO., LTD.) and 153.66 g of PGMEA were charged (initial monomer concentration=52.5 wt %), and an aqueous phosphoric acid solution formed by dissolving 0.510 g (0.30 wt % with respect to the supplied monomers) of phosphoric acid in 53.55 g of water was added over 10 minutes while stirring at room temperature. Then, the solution was heated and stirred in the same manner as in Synthesis Example 1 to obtain a polysiloxane solution (PS-2). During the reaction, 97.58 g in total of methanol and water were distilled out as by-products. The obtained polysiloxane solution (PS-2) had a solid content concentration of 40 wt %. In addition, the content of Si atoms originated from the organosilane represented by the general formula (2) in the polysiloxane was 12.4 mol %.

Synthesis Example 3

Synthesis of Polysiloxane Solution (PS-3)

Into a 500 mL three-neck flask, 27.24 g (0.20 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane, 29.38 g (equivalent to 0.25 mol of Si atoms) of M silicate 51 (manufactured by TAMA CHEMICALS CO., LTD.) and 152.28 g of PGMEA were charged (initial monomer concentration=52.5 wt % ), and an aqueous phosphoric acid solution formed by dissolving 0.504 g (0.30 wt % with respect to the supplied monomers) of phosphoric acid in 52.62 g of water was added over 10 minutes while stirring at room temperature. Then, the solution was heated and stirred in the same manner as in Synthesis Example 1 to obtain a polysiloxane solution (PS-3). During the reaction, 95.94 g in total of methanol and water were distilled out as by-products. The obtained polysiloxane solution (PS-3) had a solid content concentration of 40 wt %. In addition, the content of Si atoms originated from the organosilane represented by the general formula (2) in the polysiloxane was 21.1 mol %.

Synthesis Example 4

Synthesis of Polysiloxane Solution (PS-4)

Into a 500 mL three-neck flask, 79.32 g (0.40 mol) of phenyltrimethoxysilane, 12.32 g (0.05 mol) of 2-(3,4-epoxycyclohexyl)ethyltrimethoxysilane, 64.63 g (equivalent to 0.55 mol of Si atoms) of M silicate 51 (manufactured by TAMA CHEMICALS CO., LTD.) and 140.57 g of PGMEA were charged (initial monomer concentration=52.6 wt %), and an aqueous phosphoric acid solution formed by dissolving 0.469 g (0.30 wt % with respect to the supplied monomers) of phosphoric acid in 49.95 g of water was added over 10 minutes while stirring at room temperature. Then, the solution was heated and stirred in the same manner as in Synthesis Example 1 to obtain a polysiloxane solution (PS-4). During the reaction, 91.02 g in total of methanol and water were distilled out as by-products. The obtained polysiloxane solution (PS-4) had a solid content concentration of 40 wt %. In addition, the content of Si atoms originated from the organosilane represented by the general formula (2) in the polysiloxane was 49.4 mol %.

Synthesis Example 5

Synthesis of Polysiloxane Solution (PS-5)

Into a 500 mL three-neck flask, 49.58 g (0.25 mol) of phenyltrimethoxysilane, 12.32 g (0.05 mol) of 2-(3,4-epoxycyclohexyl)ethyltrimethoxysilane, 82.37 g (equivalent to 0.70 mol of Si atoms) of M silicate 51 (manufactured by TAMA CHEMICALS CO., LTD.) and 127.29 g of PGMEA were charged (initial monomer concentration=53.1 wt %), and an aqueous phosphoric acid solution formed by dissolving 0.433 g (0.30 wt % with respect to the supplied monomers) of phosphoric acid in 48.60 g of water was added over 10 minutes while stirring at room temperature. Then, the solution was heated and stirred in the same manner as in Synthesis Example 1 to obtain a polysiloxane solution (PS-5). During the reaction, 88.56 g in total of methanol and water were distilled out as by-products. The obtained polysiloxane solution (PS-5) had a solid content concentration of 40 wt %. In addition, the content of Si atoms originated from the organosilane represented by the general formula (2) in the polysiloxane was 65.1 mol %.

Synthesis Example 6

Synthesis of Polysiloxane Solution (PS-6)

Into a 500 mL three-neck flask, 40.86 g (0.30 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane, 22.35 g (equivalent to 0.15 mol of Si atoms) of Silicate 40 (manufactured by TAMA CHEMICALS CO., LTD.) and 159.43 g of PGMEA were charged (initial monomer concentration=52.3 wt %), and an aqueous phosphoric acid solution formed by dissolving 0.524 g (0.30 wt % with respect to the supplied monomers) of phosphoric acid in 53.55 g of water was added over 10 minutes while stirring at room temperature. Then, the solution was heated and stirred in the same manner as in Synthesis Example 1 to obtain a polysiloxane solution (PS-6). During the reaction, 97.58 g in total of methanol and water were distilled out as by-products. The obtained polysiloxane solution (PS-6) had a solid content concentration of 40 wt %. In addition, the content of Si atoms originated from the organosilane represented by the general formula (2) in the polysiloxane was 12.4 mol %.

Synthesis Example 7

Synthesis of Polysiloxane Solution (PS-7)

Into a 500 mL three-neck flask, 40.86 g (0.30 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane, 21.72 g (equivalent to 0.15 mol of Si atoms) of Silicate 45 (manufactured by TAMA CHEMICALS CO., LTD.) and 158.65 g of PGMEA were charged (initial monomer concentration=52.3 wt %), and an aqueous phosphoric acid solution formed by dissolving 0.522 g (0.30 wt % with respect to the supplied monomers) of phosphoric acid in 53.55 g of water was added over 10 minutes while stirring at room temperature. Then, the solution was heated and stirred in the same manner as in Synthesis Example 1 to obtain a polysiloxane solution (PS-7). During the reaction, 97.58 g in total of methanol and water were distilled out as by-products. The obtained polysiloxane solution (PS-7) had a solid content concentration of 40 wt %. In addition, the content of Si atoms originated from the organosilane represented by the general formula (2) in the polysiloxane was 12.4 mol %.

Synthesis Example 8

Synthesis of Polysiloxane Solution (PS-8)

Into a 500 mL three-neck flask, 40.86 g (0.30 mol) of methyltrimethoxysilane, 69.41 g (0.35 mol) of phenyltrimethoxysilane, 12.32 g (0.05 mol) of 2-(3,4-epoxycyclohexyl)ethyltrimethoxysilane, 37.25 g (0.15 mol) of naphthyltrimethoxysilane, 17.65 g (equivalent to 0.15 mol of Si atoms) of M silicate 51 (manufactured by TAMA CHEMICALS CO., LTD.) and 163.02 g of PGMEA were charged (initial monomer concentration=52.1 wt %), and an aqueous phosphoric acid solution formed by dissolving 0.355 g (0.20 wt % with respect to the supplied monomers) of phosphoric acid in 53.55 g of water was added over 10 minutes while stirring at room temperature. Then, the solution was heated and stirred in the same manner as in Synthesis Example 1 to obtain a polysiloxane solution (PS-8). During the reaction, 97.58 g in total of methanol and water were distilled out as by-products. The obtained polysiloxane solution (PS-8) had a solid content concentration of 40 wt %. In addition, the content of Si atoms originated from the organosilane represented by the general formula (2) in the polysiloxane was 12.4 mol %. Further, the content of Si atoms bound to a condensed polycyclic aromatic hydrocarbon radical in the polysiloxane was 14.0 mol %.

Synthesis Example 9

Synthesis of Polysiloxane Solution (PS-9)

Into a 500 mL three-neck flask, 40.86 g (0.30 mol) of methyltrimethoxysilane, 39.66 g (0.20 mol) of phenyltrimethoxysilane, 12.32 g (0.05 mol) of 2-(3,4-epoxycyclohexyl)ethyltrimethoxysilane, 74.51 g (0.30 mol) of naphthyltrimethoxysilane, 17.65 g (equivalent to 0.15 mol of Si atoms) of M silicate 51 (manufactured by TAMA CHEMICALS CO., LTD.) and 172.28 g of PGMEA were charged (initial monomer concentration=51.8 wt %), and an aqueous phosphoric acid solution formed by dissolving 0.277 g (0.15 wt % with respect to the supplied monomers) of phosphoric acid in 53.55 g of water was added over 10 minutes while stirring at room temperature. Then, the solution was heated and stirred in the same manner as in Synthesis Example 1 to obtain a polysiloxane solution (PS-9). During the reaction, 97.58 g in total of methanol and water were distilled out as by-products. The obtained polysiloxane solution (PS-9) had a solid content concentration of 40 wt %. In addition, the content of Si atoms originated from the organosilane represented by the general formula (2) in the polysiloxane was 12.4 mol %. Further, the content of Si atoms bound to a condensed polycyclic aromatic hydrocarbon radical in the polysiloxane was 28.0 mol %.

Synthesis Example 10

Synthesis of Polysiloxane Solution (PS-10)

Into a 500 mL three-neck flask, 40.86 g (0.30 mol) of methyltrimethoxysilane, 12.32 g (0.05 mol) of 2-(3,4-epoxycyclohexyl)ethyltrimethoxysilane, 124.18 g (0.50 mol) of naphthyltrimethoxysilane, 17.65 g (equivalent to 0.15 mol of Si atoms) of M silicate 51 (manufactured by TAMA CHEMICALS CO., LTD.) and 184.60 g of PGMEA were charged (initial monomer concentration=51.4 wt %), and an aqueous phosphoric acid solution formed by dissolving 0.195 g (0.10 wt % with respect to the supplied monomers) of phosphoric acid in 53.55 g of water was added over 10 minutes while stirring at room temperature. Then, the solution was heated and stirred in the same manner as in Synthesis Example 1 to obtain a polysiloxane solution (PS-10). During the reaction, 97.58 g in total of methanol and water were distilled out as by-products. The obtained polysiloxane solution (PS-10) had a solid content concentration of 40 wt %. In addition, the content of Si atoms originated from the organosilane represented by the general formula (2) in the polysiloxane was 12.4 mol %. Further, the content of Si atoms bound to a condensed polycyclic aromatic hydrocarbon radical in the polysiloxane was 46.7 mol %.

Synthesis Example 11

Synthesis of Polysiloxane Solution (PS-11)

Into a 500 mL three-neck flask, 13.62 g (0.10 mol) of methyltrimethoxysilane, 12.32 g (0.05 mol) of 2-(3,4-epoxycyclohexyl)ethyltrimethoxysilane, 178.85 g (0.70 mol) of naphthyltrimethoxysilane, 17.65 g (equivalent to 0.15 mol of Si atoms) of M silicate 51 (manufactured by TAMA CHEMICALS CO., LTD.) and 212.10 g of PGMEA were charged (initial monomer concentration=50.6 wt %), and an aqueous phosphoric acid solution formed by dissolving 0.109 g (0.05 wt % with respect to the supplied monomers) of phosphoric acid in 53.55 g of water was added over 10 minutes while stirring at room temperature. Then, the solution was heated and stirred in the same manner as in Synthesis Example 1 to obtain a polysiloxane solution (PS-11). During the reaction, 97.58 g in total of methanol and water were distilled out as by-products. The obtained polysiloxane solution (PS-11) had a solid content concentration of 40 wt %. In addition, the content of Si atoms originated from the organosilane represented by the general formula (2) in the polysiloxane was 12.4 mol %. Further, the content of Si atoms bound to a condensed polycyclic aromatic hydrocarbon radical in the polysiloxane was 65.3 mol %.

Synthesis Example 12

Synthesis of Polysiloxane Solution (PS-12)

Into a 500 mL three-neck flask, 61.29 g (0.45 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane and 155.73 g of PGMEA were charged (initial monomer concentration=52.6 wt %), and an aqueous phosphoric acid solution formed by dissolving 0.518 g (0.30 wt % with respect to the supplied monomers) of phosphoric acid in 54.90 g of water was added over 10 minutes while stirring at room temperature. Then, the solution was heated and stirred in the same manner as in Synthesis Example 1 to obtain a polysiloxane solution (PS-12). During the reaction, 100.04 g in total of methanol and water were distilled out as by-products. The obtained polysiloxane solution (PS-12) had a solid content concentration of 40 wt %.

Synthesis Example 13 Synthesis of Polysiloxane Solution (PS-13)

Into a 500 mL three-neck flask, 40.86 g (0.30 mol (0.30 mol of silane atoms)) of methyltrimethoxysilane, 99.15 g (0.50 mol (0.50 mol of silane atoms)) of phenyltrimethoxysilane, 12.32 g (0.05 mol (0.05 mol of silane atoms)) of 2-(3,4-epoxycyclohexyl)ethyltrimethoxysilane, 11.38 g (equivalent to 0.021 mol (equivalent to 0.15 mol of silane atoms)) of silanol-terminated polydimethylsiloxane DMS-S12 (Mw: 400 to 700) manufactured by Gelest Inc. as a linear polysiloxane and 146.05 g of PGMEA were charged (initial monomer concentration =52.9 wt %), and an aqueous phosphoric acid solution formed by dissolving 0.491 g (0.30 wt % with respect to the supplied monomers) of phosphoric acid in 46.80 g of water was added over 10 minutes while stirring at room temperature. Then, the solution was heated and stirred in the same manner as in Synthesis Example 1 to obtain a polysiloxane solution (PS-13). During the reaction, 88.69 g in total of methanol and water were distilled out as by-products. The obtained polysiloxane solution (PS-13) had a solid content concentration of 43 wt %.

Synthesis Example 14 Synthesis of Trifunctional Silane Oligomer Solution (TS-1)

Into a 500 mL three-neck flask, 54.48g (0.40 mol of silane atoms) of methyltrimethoxysilane, 118.98 g (0.60 mol of silane atoms) of phenyltrimethoxysilane and 157.83 g of PGMEA were charged (initial monomer concentration=52.4 wt %), and an aqueous phosphoric acid solution formed by dissolving 0.173 g (0.10 wt % with respect to the supplied monomers) of phosphoric acid in 54.00 g of water was added over 10 minutes while stirring at room temperature. Then, the flask was immersed in an oil bath of 40° C. while stirring the solution for 60 minutes, and the temperature of the oil bath was raised up to 115° C. over 30 minutes. One hour after the start of temperature rise, the internal temperature of the solution reached 100° C., and the solution was heated and stirred for further 1 hour (the internal temperature of the solution in the duration was 100 to 110° C.) to obtain a trifunctional silane oligomer solution (TS-1). During the reaction, 86.10 g in total of methanol and water were distilled out as by-products. The obtained trifunctional silane oligomer solution (TS-1) had a solid content concentration of 38 wt %. In addition, the weight average molecular weight (Mw) of the obtained trifunctional oligomer was 630.

Synthesis Example 15 Synthesis of Trifunctional Silane Oligomer Solution (TS-2)

Into a 500 mL three-neck flask, 54.48 g (0.40 mol of silane atoms) of methyltrimethoxysilane, 118.98 g (0.60 mol of silane atoms) of phenyltrimethoxysilane and 157.49 g of PGMEA were charged (initial monomer concentration=52.4 wt %), and an aqueous phosphoric acid solution formed by dissolving 0.520 g (0.30 wt % with respect to the supplied monomers) of phosphoric acid in 54.00 g of water was added over 10 minutes while stirring at room temperature. Then, the flask was immersed in an oil bath of 40° C. while stirring the solution for 60 minutes, and the temperature of the oil bath was raised up to 115° C. over 30 minutes. One hour after the start of temperature rise, the internal temperature of the solution reached 100° C., and the solution was heated and stirred for further 1 hour (the internal temperature of the solution in the duration was 100 to 110° C.) to obtain a trifunctional silane oligomer solution (TS-1). During the reaction, 98.40 g in total of methanol and water were distilled out as by-products. The obtained trifunctional silane oligomer solution (TS-1) had a solid content concentration of 40 wt %. In addition, the weight average molecular weight (Mw) of the obtained trifunctional oligomer was 1800.

Synthesis Example 16

Synthesis of Trifunctional Silane Oligomer Solution (TS-3)

Into a 500 mL three-neck flask, 54.48g (0.40 mol of silane atoms) of methyltrimethoxysilane, 118.98 g (0.60 mol of silane atoms) of phenyltrimethoxysilane and 157.49 g of PGMEA were charged (initial monomer concentration=52.4 wt %), and an aqueous phosphoric acid solution formed by dissolving 0.520 g (0.30 wt % with respect to the supplied monomers) of phosphoric acid in 54.00 g of water was added over 10 minutes while stirring at room temperature. Then, the flask was immersed in an oil bath of 40° C. while stirring the solution for 60 minutes, and the temperature of the oil bath was raised up to 115° C. over 30 minutes. One hour after the start of temperature rise, the internal temperature of the solution reached 100° C., and the solution was heated and stirred for further 3 hours (the internal temperature of the solution in the duration was 100 to 110° C.) to obtain a trifunctional silane oligomer solution (TS-3). During the reaction, 104.55 g in total of methanol and water were distilled out as by-products. The obtained trifunctional silane oligomer solution (TS-1) had a solid content concentration of 42 wt %. In addition, the weight average molecular weight (Mw) of the obtained trifunctional oligomer was 4700.

Synthesis Example 17

Synthesis of Polysiloxane Solution (PTS-1)

Into a 500 mL three-neck flask, 40.86 g (0.30 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane, 13.74 g (equivalent to 0.05 mol of silane atoms) of the trifunctional silane oligomer solution (TS-1) obtained in Synthesis Example 14 as a trifunctional oligomer, 11.77 g (equivalent to 0.10 mol of silane atoms) of M silicate 51 (manufactured by TAMA CHEMICALS CO., LTD.) and 146.62 g of PGMEA were charged (initial monomer concentration=52.2 wt %), and an aqueous phosphoric acid solution formed by dissolving 0.508 g (0.30 wt % with respect to the supplied monomers and oligomers) of phosphoric acid in 51.30 g of water was added over 10 minutes while stirring at room temperature. Then, the solution was heated and stirred in the same manner as in Synthesis Example 1 to obtain a polysiloxane solution (PTS-1). During the reaction, 93.48 g in total of methanol and water were distilled out as by-products. The obtained polysiloxane solution (PTS-1) had a solid content concentration of 42 wt %. In addition, the content of Si atoms originated from the organosilane represented by the general formula (2) in the polysiloxane was 8.2 mol %.

Synthesis Example 18

Synthesis of Polysiloxane Solution (PTS-2)

Into a 500 mL three-neck flask, 40.86 g (0.30 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane, 41.21 g (equivalent to 0.15 mol of silane atoms) of the trifunctional silane oligomer solution (TS-1) obtained in Synthesis Example 14 as a trifunctional oligomer and 132.47 g of PGMEA were charged (initial monomer and oligomer concentration=51.5 wt %), and an aqueous phosphoric acid solution formed by dissolving 0.504 g (0.30 wt % with respect to the supplied monomers and oligomers) of phosphoric acid in 46.80 g of water was added over 10 minutes while stirring at room temperature. Then, the solution was heated and stirred in the same manner as in Synthesis Example 1 to obtain a polysiloxane solution (PTS-2). During the reaction, 91.68 g in total of methanol and water were distilled out as by-products. The obtained polysiloxane solution (PTS-2) had a solid content concentration of 42 wt %.

Synthesis Example 19

Synthesis of Polysiloxane Solution (PTS-3)

Into a 500 mL three-neck flask, 40.86 g (0.30 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane, 39.15 g (equivalent to 0.15 mol of silane atoms) of the trifunctional silane oligomer solution (TS-2) obtained in Synthesis Example 15 as a trifunctional oligomer and 134.53 g of PGMEA were charged (initial monomer and oligomer concentration=51.5 wt %), and an aqueous phosphoric acid solution formed by dissolving 0.504 g (0.30 wt % with respect to the supplied monomers and oligomers) of phosphoric acid in 46.80 g of water was added over 10 minutes while stirring at room temperature. Then, the solution was heated and stirred in the same manner as in Synthesis Example 1 to obtain a polysiloxane solution (PTS-3). During the reaction, 88.48 g in total of methanol and water were distilled out as by-products. The obtained polysiloxane solution (PTS-3) had a solid content concentration of 43 wt %.

Synthesis Example 20

Synthesis of Polysiloxane Solution (PTS-4)

Into a 500 mL three-neck flask, 40.86 g (0.30 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane, 37.28 g (equivalent to 0.15 mol of silane atoms) of the trifunctional silane oligomer solution (TS-3) obtained in Synthesis Example 16 as a trifunctional oligomer and 134.53 g of PGMEA were charged (initial monomer and oligomer concentration=51.5 wt %), and an aqueous phosphoric acid solution formed by dissolving 0.504 g (0.30 wt % with respect to the supplied monomers and oligomers) of phosphoric acid in 46.80 g of water was added over 10 minutes while stirring at room temperature. Then, the solution was heated and stirred in the same manner as in Synthesis Example 1 to obtain a polysiloxane solution (PTS-4). During the reaction, 85.28 g in total of methanol and water were distilled out as by-products. The obtained polysiloxane solution (PTS-3) had a solid content concentration of 44 wt %.

Synthesis Example 21

Synthesis of Solution of Polysiloxane Containing Metal Compound Particles (MPS-1)

Into a 1000 mL three-neck flask, 40.86 g (0.30 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane, 17.65 g (0.15 mol) of M silicate 51 (manufactured by TAMA CHEMICALS CO., LTD.) and 153.69 g of PGMEA were charged (initial monomer concentration=52.5 wt %), and 340.82 g (the amount of particles is 100 parts by weight relative to 100 parts by weight of the weight (103.61 g) in the case where the organosilane is completely condensed) of "OPTOLAKE" TR-513 (trade name, manufactured by JGC Catalysts and Chemicals Ltd.), which is a 30.4 wt % GBL dispersion of complex particles of titanium oxide and silicon oxide, was further added to the system. An aqueous phosphoric acid solution formed by dissolving 0.510 g (0.30 wt % with respect to the supplied monomers) of phosphoric acid in 53.55 g of water was added over 10 minutes while stirring the resulting mixture at room temperature. Then, the solution was heated and stirred in the same manner as in Synthesis Example 1 to obtain a solution of polysiloxane containing metal compound particles (MPS-1). During the reaction, 97.58 g in total of methanol and water were distilled out as by-products. The obtained solution of polysiloxane containing metal compound particles (MPS-1) had a solid content concentration of 35 wt %. In addition, the content of Si atoms originated from the organosilane represented by the general formula (2) in the polysiloxane containing metal compound particles was 12.4 mol %.

Synthesis Example 22

Synthesis of Solution of Polysiloxane Containing Metal Compound Particles (MPS-2)

Into a 1000 mL three-neck flask, 61.29 g (0.45 mol) of methyltrimethoxysilane, 99.15 g (0.50 mol) of phenyltrimethoxysilane, 12.32 g (0.05 mol) of 2-(3,4-epoxycyclohexyl)ethyltrimethoxysilane and 155.73 g of PGMEA were charged (initial monomer concentration=52.6 wt %), and 344.27 g (the amount of particles is 100 parts by weight relative to 100 parts by weight of the weight (104.66 g) in the case where the organosilane is completely condensed) of "OPTOLAKE" TR-513 (trade name, manufactured by JGC Catalysts and Chemicals Ltd.), which is a 30.4 wt % GBL dispersion of complex particles of titanium oxide and silicon oxide, was further added to the system. An aqueous phosphoric acid solution formed by dissolving 0.518 g (0.30 wt % with respect to the supplied monomers) of phosphoric acid in 54.90 g of water was added over 10 minutes while stirring the resulting mixture at room temperature. Then, the solution was heated and stirred in the same manner as in Synthesis Example 1 to obtain a solution of polysiloxane containing metal compound particles (MPS-2). During the reaction, 100.04 g in total of methanol and water were distilled out as by-products. The obtained solution of polysiloxane containing metal compound particles (MPS-2) had a solid content concentration of 35 wt %.

Synthesis Example 23

Synthesis of Naphthoquinonediazide Compound (QD-1)

In a dry nitrogen stream, 15.32 g (0.05 mol) of Ph-cc-AP-MF (trade name, manufactured by Honshu Chemical Industry Co., Ltd.) and 37.62 g (0.14 mol) of 5-naphthoquinonediazide sulfonic acid chloride were dissolved in 450 g of 1,4-dioxane, and the resulting solution was kept at room temperature. To the solution, a mixture of 50 g of 1,4-dioxane and 15.58 g (0.154 mol) of triethylamine was added dropwise to ensure that the temperature in the system would not become 35° C. or higher. After completion of dropwise addition, the mixture was stirred at 30° C. for 2 hours. The triethylamine salt was filtered away, and the filtrate was charged into water. Thereafter, the precipitate was collected by filtration. The precipitate was dried using a vacuum dryer to obtain the naphthoquinonediazide compound (QD-1) having the following structure:

[Chem. 7]

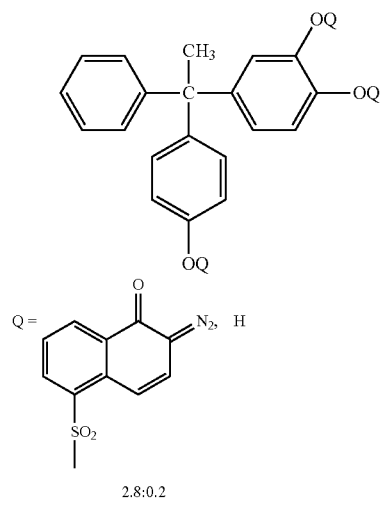

Synthesis Example 24

Synthesis of Naphthoquinonediazide Compound (QD-2)

In a dry nitrogen stream, 21.23 g (0.05 mol) of Tris P-PA (trade name, manufactured by Honshu Chemical Industry Co., Ltd.) and 37.62 g (0.14 mol) of 5-naphthoquinonediazide sulfonic acid chloride were dissolved in 450 g of 1,4-dioxane, and the resulting solution was kept at room temperature. To the solution, a mixture of 50 g of 1, 4-dioxane and 15.58 g (0.154 mol) of triethylamine was added dropwise to ensure that the temperature in the system would not become 35° C. or higher. After completion of dropwise addition, the mixture was stirred at 30° C. for 2 hours. The triethylamine salt was filtered away, and the filtrate was charged into water. Thereafter, the precipitate was collected by filtration. The precipitate was dried using a vacuum dryer to obtain the naphthoquinonediazide compound (QD-2) having the following structure:

[Chem. 8]

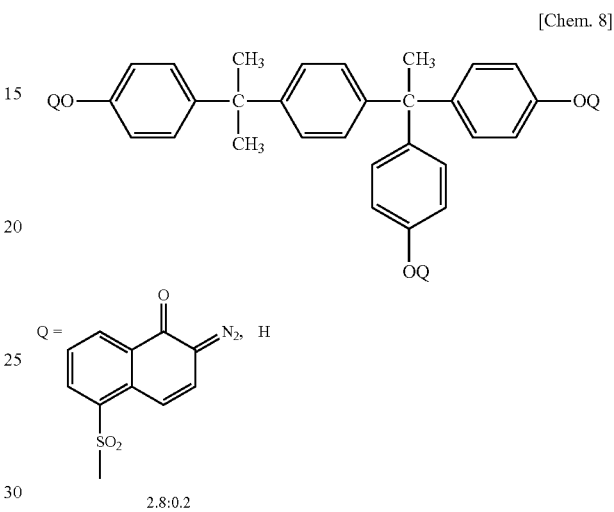

Photosensitivity and cured film properties of the composition in each of examples and comparative examples were evaluated by the following methods. A silicon wafer substrate was used for the following evaluations (1) to (5) and a TEMPAX Float glass substrate was used for the following evaluation (6).

(1) Measurement of Film Thickness

Using Lambda-Ace STM-602 (trade name, manufactured by Dainippon Screen Manufacturing Co., Ltd.), thicknesses of a prebaked film and a cured film was measured at a refractive index of 1.70.

(2) Determination of Remaining Film Ratio

The remaining film ratio was calculated from the following equation.

Remaining film ratio (%)=Film thickness of unexposed area after development/Film thickness after prebaking ×100

(3) Determination of Photosensitivity

The exposure amount at which a 10 μm line and space pattern is formed at a width ratio of 1:1 after development (hereinafter, the exposure amount is referred to as an optimum exposure amount) was taken as the photosensitivity.

(4) Determination of Resolution

The minimum pattern size at the optimum exposure amount after development was referred to as a resolution after development and the minimum pattern size at the optimum exposure amount after curing was referred to as a resolution after curing.

(5) Determination of Refractive Index

The cured film formed on the 6 inch silicon wafer was used to measure the refractive index (TE) in a direction perpendicular to a film surface at 22° C. at a wavelength of 633 nm (using a He—Ne laser) by use of a prism coupler Model 2010 (manufactured by Metricon Corp.) and the film thickness.

(6) Measurement of Light Transmittance

First, only a TEMPAX Float glass substrate was measured using MultiSpec-1500 (trade name, manufactured by Shimadzu Corp.), and the absorption spectrum in the ultraviolet and visible region thereof was employed as a reference. Next, a cured film of the composition was formed on the TEMPAX Float glass substrate (pattern exposure was not performed), and this sample was measured with a single beam to determine the light transmittance per 1 μm at a wavelength of 400 nm, and the difference between the light transmittance and the reference was taken as the light transmittance of the cured film.

Example 1

23.53 g of the polysiloxane solution (PS-1) obtained in Synthesis Example 1, 30.96 g of "OPTOLAKE" TR-513 (trade name, manufactured by JGC Catalysts and Chemicals Ltd.) which is a 30.4 wt % GBL dispersion of complex particles of titanium oxide and silicon oxide, 1.18 g of the naphthoquinonediazide compound (QD-1) obtained in Synthesis Example 14, 14.45 g of GBL, 12.00 g of DAA and 17.88 g of PGMEA were mixed and stirred under a yellow lamp to form a uniform solution, and then filtrated with a filter with a pore size of 0.20 μm to prepare a composition 1.

The composition 1 was applied onto a 6 inch silicon wafer by spin coating using a spin coater (1H-3605 manufactured by Mikasa Co., Ltd.) and then heated at 120° C. for 3 minutes by use of a hot plate (SCW-636 manufactured by Dainippon Screen Mfg. Co., Ltd.) to prepare a prebaked film with a thickness of 1.0 μm. The prebaked film was exposed through a gray scale mask for photosensitivity measurement to an ultra high pressure mercury lamp using a PLA (PLA-501F manufactured by Canon Inc.), and developed with a shower of 2.38 wt % aqueous (TMAH) solution for 60 seconds using an automatic developing machine (AD-2000 manufactured by Takizawa Sangyo Co., Ltd.), and then rinsed with water for 30 seconds. Thereafter, as bleaching exposure, a PLA (PLA-501F manufactured by Canon Inc.) was used to expose the entire film surface to an ultra high pressure mercury lamp at 5000 J/m$^2$ (in terms of the exposure amount at a wavelength of 365 nm). Then, a hot plate was used for soft baking at 200° C. for 5 minutes, and then used for curing at 300° C. for 5 minutes to prepare a cured film. Composition of the composition 1 is shown in Table 1 and the results of evaluations of photosensitivity and cured film properties are shown in Table 2.

Examples 2 to 19 and Comparative Examples 1 to 8

Compositions 2 to 27 each having the compositions shown in Tables 1 and 2 were prepared in the same manner as in the composition 1. A cured film was prepared in the same manner as in Example 1 by use of each of the obtained compositions. The results of evaluations are shown in Tables 3 and 4.

TABLE 1

|  | Addition amount of polysiloxane solution (a = content of Si atoms originated from formula (2)) (b = content of Si atoms bound to condensed polycyclic aromatic hydrocarbon radical) | Addition amount of dispersion of metal compound particles (parts by weight of solids relative to 100 of polysiloxane) | Addition amount of naphthoquinonediazide compound (parts by weight of solids relative to 100 of polysiloxane) | Addition amount of solvent |
|---|---|---|---|---|
| Composition 1 | PS-1: 23.53 g (a = 4.0 mol %) (b = 0 mol %) | TR-513: 30.96 g (100 parts by weight) | QD-1: 1.18 g (12.5 parts by weight) | GBL: 14.45 g DAA: 12.00 g PGMEA: 17.88 g |
| Composition 2 | PS-2: 23.53 g (a = 12.4 mol %) (b = 0 mol %) | TR-513: 30.96 g (100 parts by weight) | QD-1: 1.18 g (12.5 parts by weight) | GBL: 14.45 g DAA: 12.00 g PGMEA: 17.88 g |
| Composition 3 | PS-3: 23.53 g (a = 21.1 mol %) (b = 0 mol %) | TR-513: 30.96 g (100 parts by weight) | QD-1: 1.18 g (12.5 parts by weight) | GBL: 14.45 g DAA: 12.00 g PGMEA: 17.88 g |
| Composition 4 | PS-4: 23.53 g (a = 49.4 mol %) (b = 0 mol %) | TR-513: 30.96 g (100 parts by weight) | QD-1: 1.18 g (12.5 parts by weight) | GBL: 14.45 g DAA: 12.00 g PGMEA: 17.88 g |
| Composition 5 | PS-5: 23.53 g (a = 65.1 mol %) (b = 0 mol %) | TR-513: 30.96 g (100 parts by weight) | QD-1: 1.18 g (12.5 parts by weight) | GBL: 14.45 g DAA: 12.00 g PGMEA: 17.88 g |
| Composition 6 | PS-6: 23.53 g (a = 12.4 mol %) (b = 0 mol %) | TR-513: 30.96 g (100 parts by weight) | QD-1: 1.18 g (12.5 parts by weight) | GBL: 14.45 g DAA: 12.00 g PGMEA: 17.88 g |
| Composition 7 | PS-7: 23.53 g (a = 12.4 mol %) (b = 0 mol %) | TR-513: 30.96 g (100 parts by weight) | QD-1: 1.18 g (12.5 parts by weight) | GBL: 14.45 g DAA: 12.00 g PGMEA: 17.88 g |
| Composition 8 | PS-8: 23.53 g (a = 12.4 mol %) (b = 14.0 mol %) | TR-513: 30.96 g (100 parts by weight) | QD-1: 1.18 g (12.5 parts by weight) | GBL: 14.45 g DAA: 12.00 g PGMEA: 17.88 g |
| Composition 9 | PS-9: 23.53 g (a = 12.4 mol %) (b = 28.0 mol %) | TR-513: 30.96 g (100 parts by weight) | QD-1: 1.18 g (12.5 parts by weight) | GBL: 14.45 g DAA: 12.00 g PGMEA: 17.88 g |
| Composition 10 | PS-10: 23.53 g (a = 12.4 mol %) (b = 46.7 mol %) | TR-513: 30.96 g (100 parts by weight) | QD-1: 1.18 g (12.5 parts by weight) | GBL: 14.45 g DAA: 12.00 g PGMEA: 17.88 g |
| Composition 11 | PS-11: 23.53 g (a = 12.4 mol %) (b = 65.3 mol %) | TR-513: 30.96 g (100 parts by weight) | QD-1: 1.18 g (12.5 parts by weight) | GBL: 14.45 g DAA: 12.00 g PGMEA: 17.88 g |

TABLE 1-continued

| | Addition amount of polysiloxane solution (a = content of Si atoms originated from formula (2)) (b = content of Si atoms bound to condensed polycyclic aromatic hydrocarbon radical) | Addition amount of dispersion of metal compound particles (parts by weight of solids relative to 100 of polysiloxane) | Addition amount of naphthoquinonediazide compound (parts by weight of solids relative to 100 of polysiloxane) | Addition amount of solvent |
|---|---|---|---|---|
| Composition 12 | PS-2: 23.53 g (a = 12.4 mol %) (b = 0 mol %) | TR-513: 20.64 g (50 parts by weight) | QD-1: 1.18 g (12.5 parts by weight) | GBL: 14.45 g DAA: 12.00 g PGMEA: 17.88 g |
| Composition 13 | PS-2: 23.53 g (a = 12.4 mol %) (b = 0 mol %) | TR-513: 37.15 g (150 parts by weight) | QD-1: 1.18 g (12.5 parts by weight) | GBL: 14.45 g DAA: 12.00 g PGMEA: 17.88 g |

TABLE 2

| | Addition amount of polysiloxane solution (a = content of Si atoms originated from formula (2)) (b = content of Si atoms bound to condensed polycyclic aromatic hydrocarbon radical) | Addition amount of dispersion of metal compound particles (parts by weight of solids relative to 100 of polysiloxane) | Addition amount of naphthoquinonediazide compound (parts by weight of solids relative to 100 of polysiloxane) | Addition amount of solvent |
|---|---|---|---|---|
| Composition 14 | PS-2: 23.53 g (a = 12.4 mol %) (b = 0 mol %) | TR-513: 30.96 g (100 parts by weight) | QD-1: 0.47 g (5 parts by weight) | GBL: 14.45 g DAA: 12.00 g PGMEA: 17.88 g |
| Composition 15 | PS-2: 23.53 g (a = 12.4 mol %) (b = 0 mol %) | TR-513: 30.96 g (100 parts by weight) | QD-1: 1.88 g (20 parts by weight) | GBL: 14.45 g DAA: 12.00 g PGMEA: 17.88 g |
| Composition 16 | PS-2: 23.53 g (a = 12.4 mol %) (b = 0 mol %) | TR-513: 30.96 g (100 parts by weight) | QD-1: 2.35 g (25 parts by weight) | GBL: 14.45 g DAA: 12.00 g PGMEA: 17.88 g |
| Composition 17 | PS-2: 23.53 g (a = 12.4 mol %) (b = 0 mol %) | TR-513: 30.96 g (100 parts by weight) | QD-2: 1.18 g (12.5 parts by weight) | GBL: 14.45 g DAA: 12.00 g PGMEA: 17.88 g |
| Composition 18 | MPS-1: 26.89 g (a = 12.4 mol %) (b = 0 mol %) | — | QD-1: 1.18 g (12.5 parts by weight) | GBL: 14.45 g DAA: 12.00 g PGMEA: 17.88 g |
| Composition 19 | PS-12: 23.53 g (a = 0%) (b = 0%) | TR-513: 30.96 g (100 parts by weight) | QD-1: 1.18 g (12.5 parts by weight) | GBL: 14.45 g DAA: 12.00 g PGMEA: 17.88 g |
| Composition 20 | PS-2: 23.53 g (a = 12.4 mol %) (b = 0 mol %) | — | QD-1: 1.18 g (12.5 parts by weight) | GBL: 14.45 g DAA: 12.00 g PGMEA: 17.88 g |
| Composition 21 | PS-10: 23.53 g (a = 12.4 mol %) (b = 46.7 mol %) | — | QD-1: 1.18 g (12.5 parts by weight) | GBL: 14.45 g DAA: 12.00 g PGMEA: 17.88 g |
| Composition 22 | MPS-2: 26.89 g (a = 0 mol %) (b = 0 mol %) | — | QD-1: 1.18 g (12.5 parts by weight) | GBL: 14.45 g DAA: 12.00 g PGMEA: 17.88 g |
| Composition 23 | PS-13: 21.89 g (a = 0%) (b = 0%) | TR-513: 30.96 g (100 parts by weight) | QD-1: 1.18 g (12.5 parts by weight) | GBL: 14.45 g DAA: 12.00 g PGMEA: 19.52 g |
| Composition 24 | PTS-1: 22.41 g (a = 8.2 mol %) (b = 0 mol %) | TR-513: 30.96 g (100 parts by weight) | QD-1: 1.18 g (12.5 parts by weight) | GBL: 14.45 g DAA: 12.00 g PGMEA: 19.00 g |
| Composition 25 | PTS-2: 22.41 g (a = 0 mol %) (b = 0 mol %) | TR-513: 30.96 g (100 parts by weight) | QD-1: 1.18 g (12.5 parts by weight) | GBL: 14.45 g DAA: 12.00 g PGMEA: 19.00 g |
| Composition 26 | PTS-3: 21.89 g (a = 0%) (b = 0 mol %) | TR-513: 30.96 g (100 parts by weight) | QD-1: 1.18 g (12.5 parts by weight) | GBL: 14.45 g DAA: 12.00 g PGMEA: 19.52 g |
| Composition 27 | PTS-4: 21.39 g (a = 0 mol %) (b = 0 mol %) | TR-513: 30.96 g (100 parts by weight) | QD-1: 1.18 g (12.5 parts by weight) | GBL: 14.45 g DAA: 12.00 g PGMEA: 20.02 g |

TABLE 3

| | Composition | Photosensitivity | | | | Cured film properties | | | |
|---|---|---|---|---|---|---|---|---|---|
| | | Film thickness after prebaking (μm) | Remaining Film Ratio (%) | Photosensitivity (J/m$^2$) | Resolution after development (μm) | Film thickness after curing (μm) | Resolution after curing (μm) | Refractive index (550 nm) | Light transmittance (%) [on 1 μm equivalent basis] |
| Example 1 | composition 1 | 1.0 | 92 | 1200 | 5 | 0.87 | 8 | 1.70 | 95 |
| Example 2 | composition 2 | 1.0 | 92 | 800 | 3 | 0.87 | 3 | 1.70 | 95 |
| Example 3 | composition 3 | 1.0 | 91 | 800 | 3 | 0.86 | 3 | 1.70 | 95 |
| Example 4 | composition 4 | 1.0 | 90 | 820 | 3 | 0.86 | 3 | 1.70 | 95 |
| Example 5 | composition 5 | 1.0 | 90 | 850 | 3 | 0.86 | 3 | 1.70 | 90 |
| Example 6 | composition 6 | 1.0 | 90 | 800 | 3 | 0.86 | 3 | 1.70 | 95 |
| Example 7 | composition 7 | 1.0 | 90 | 900 | 3 | 0.86 | 3 | 1.70 | 95 |
| Example 8 | composition 8 | 1.0 | 92 | 600 | 2 | 0.86 | 2 | 1.72 | 95 |
| Example 9 | composition 9 | 1.0 | 93 | 400 | 1 | 0.86 | 1 | 1.73 | 95 |
| Example 10 | composition 10 | 1.0 | 92 | 400 | 2 | 0.85 | 2 | 1.75 | 94 |
| Example 11 | composition 11 | 1.0 | 92 | 400 | 4 | 0.83 | 4 | 1.77 | 94 |
| Example 12 | composition 12 | 1.0 | 93 | 800 | 3 | 0.88 | 3 | 1.65 | 96 |
| Example 13 | composition 13 | 1.0 | 90 | 700 | 3 | 0.86 | 3 | 1.73 | 93 |
| Example 14 | composition 14 | 1.0 | 85 | 1000 | 5 | 0.81 | 5 | 1.70 | 96 |
| Example 15 | composition 15 | 1.0 | 95 | 700 | 2 | 0.90 | 2 | 1.70 | 92 |
| Example 16 | composition 16 | 1.0 | 96 | 700 | 2 | 0.91 | 2 | 1.70 | 90 |
| Example 17 | composition 17 | 1.0 | 94 | 900 | 3 | 0.89 | 3 | 1.70 | 96 |
| Example 18 | composition 18 | 1.0 | 92 | 1000 | 5 | 0.87 | 5 | 1.70 | 96 |
| Example 19 | composition 24 | 1.0 | 93 | 1200 | 7 | 0.88 | 9 | 1.70 | 95 |

TABLE 4

| | Composition | Photosensitivity | | | | Cured film properties | | | |
|---|---|---|---|---|---|---|---|---|---|
| | | Film thickness after prebaking (μm) | Remaining Film Ratio (%) | Photosensitivity (J/m$^2$) | Resolution after development (μm) | Film thickness after curing (μm) | Resolution after curing (μm) | Refractive index (550 nm) | Light transmittance (%) [on 1 μm equivalent basis] |
| Comparative Example 1 | composition 19 | 1.0 | 92 | 2000 | 10 | 0.86 | 10 | 1.70 | 95 |
| Comparative Example 2 | composition 20 | 1.0 | 90 | 600 | 3 | 0.86 | 4 | 1.53 | 97 |
| Comparative Example 3 | composition 21 | 1.0 | 92 | 800 | 2 | 0.87 | 3 | 1.60 | 97 |
| Comparative Example 4 | composition 22 | 1.0 | 93 | 2500 | 10 | 0.87 | 10 | 1.70 | 96 |
| Comparative Example 5 | composition 23 | 1.0 | 93 | 2000 | 10 | 0.89 | 20 | 1.70 | 95 |
| Comparative Example 6 | composition 25 | 1.0 | 93 | 2200 | 10 | 0.89 | 12 | 1.70 | 95 |
| Comparative Example 7 | composition 26 | 1.0 | 95 | 2500 | 10 | 0.90 | 11 | 1.70 | 95 |
| Comparative Example 8 | composition 27 | 1.0 | 95 | 3000 | 10 | 0.91 | 10 | 1.70 | 95 |

INDUSTRIAL APPLICABILITY

The resin composition of the present invention can provide a positive photosensitive resin composition having excellent sensitivity and resolution without deteriorating high refractive index and high transparency.

The invention claimed is:

1. A positive photosensitive resin composition comprising
(a) a polysiloxane synthesized by hydrolyzing and partially condensing an organosilane represented by the following general formula (1):

wherein $R^1$ represents hydrogen, an alkyl group having 1 to 10 carbon atoms, an alkenyl group having 2 to 10 carbon atoms or an aryl group having 6 to 16 carbon atoms, $R^2$ represents hydrogen, an alkyl group having 1 to 6 carbon atoms, an acyl group having 2 to 6 carbon atoms or an aryl group having 6 to 16 carbon atoms, n represents an integer of 0 to 3, and if n is 2 or more, plural $R^1$s may be the same or different and if n is 2 or less, plural $R^2$s may be the same or different, and an organosilane represented by the following general formula (2):

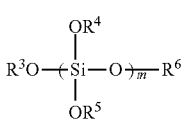

wherein $R^3$ to $R^6$ each independently represent hydrogen, an alkyl group having 1 to 6 carbon atoms, an acyl group having 2 to 6 carbon atoms or an aryl group having 6 to 16 carbon atoms, m represents a numerical value of 2 to 8 and if m is 2 or more, plural $R^4$s and $R^5$s may each be the same or different;
- (b) aluminum compound particles, tin compound particles, titanium compound particles, zirconium compound particles, complex particles of the compounds or complex particles of any of the compounds and a silicon compound;
- (c) a naphthoquinonediazide compound; and
- (d) a solvent.

2. A positive photosensitive resin composition comprising
- (a') a polysiloxane containing metal compound particles synthesized by hydrolyzing and partially condensing an organosilane represented by the following general formula (1):

wherein $R^1$ represents hydrogen, an alkyl group having 1 to 10 carbon atoms, an alkenyl group having 2 to 10 carbon atoms or an aryl group having 6 to 16 carbon atoms, $R^2$ represents hydrogen, an alkyl group having 1 to 6 carbon atoms, an acyl group having 2 to 6 carbon atoms or an aryl group having 6 to 16 carbon atoms, n represents an integer of 0 to 3, and if n is 2 or more, plural $R^1$ s may be the same or different and if n is 2 or less, plural $R^2$s may be the same or different, and an organosilane oligomer in the presence of aluminum compound particles, tin compound particles, titanium compound particles, zirconium compound particles, complex particles of the compounds or complex particles of any of the compounds and a silicon compound;
- (c) a naphthoquinonediazide compound; and
- (d) a solvent,
wherein the organosilane oligomer contains an organosilane represented by the following general formula (2):

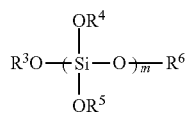

wherein $R^3$ to $R^6$ each independently represent hydrogen, an alkyl group having 1 to 6 carbon atoms, an acyl group having 2 to 6 carbon atoms or an aryl group having 6 to 16 carbon atoms, m represents a numerical value of 2 to 8 and if m is 2 or more, plural $R^4$s and $R^5$s may each be the same or different.

3. The positive photosensitive resin composition according to claim 1, wherein $R^1$ in the general formula (1) contains a condensed polycyclic aromatic hydrocarbon radical.

4. The positive photosensitive resin composition according to claim 2, wherein the content of Si atoms originated from the organosilane represented by the general formula (2) in the organosilane oligomer is 67 mol % or more and 100 mol % or less of the total content of Si atoms originated from the organosilane oligomer.

5. A positive photosensitive resin composition comprising
- (a') a polysiloxane containing metal compound particles, which is synthesized by hydrolyzing and partially condensing an organosilane represented by the general formula (1):

wherein $R^1$ represents hydrogen, an alkyl group having 1 to 10 carbon atoms, an alkenyl group having 2 to 10 carbon atoms or an aryl group having 6 to 16 carbon atoms, $R^2$ represents hydrogen, an alkyl group having 1 to 6 carbon atoms, an acyl group having 2 to 6 carbon atoms or an aryl group having 6 to 16 carbon atoms, n represents an integer of 0 to 3, and if n is 2 or more, plural $R^1$s may be the same or different and if n is 2 or less, plural $R^2$s may be the same or different, and an organosilane represented by the general formula (2):

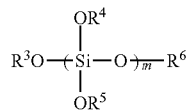

wherein $R^3$ to $R^6$ each independently represent hydrogen, an alkyl group having 1 to 6 carbon atoms, an acyl group having 2 to 6 carbon atoms or an aryl group having 6 to 16 carbon atoms., m represents a numerical value of 2 to 8 and when m is 2 or more, plural $R^4$s and $R^5$s may each be the same or different., in the presence of aluminum compound particles, tin compound particles, titanium compound particles, zirconium compound particles, complex particles of the compounds or complex particles of any of the compounds and a silicon compound,
- (c) a naphthoquinonediazide compound and
- (d) a solvent.

6. The positive photosensitive resin composition according to claim 1, wherein the content of Si atoms originated from the organosilane represented by the general formula (2) in the polysiloxane (a) is 5 mol % or more and 50 mol % or less of the total content of Si atoms originated from an organosilane.

7. The positive photosensitive resin composition according to claim 2, wherein the content of Si atoms originated from the organosilane represented by the general formula (2) in the polysiloxane containing metal compound particles (a') is 5 mol % or more and 50 mol % or less of the total content of Si atoms originated from the organosilane in the polysiloxane containing metal compound particles.

8. The positive photosensitive resin composition according to claim 3, wherein n in the general formula (1) is 1, and in the polysiloxane (a), the content of Si atoms bound to $R^1$, which is a condensed polycyclic aromatic hydrocarbon radical, is 10 mol % or more of the total content of Si atoms originated from the organosilane.

9. A cured film formed by curing the positive photosensitive resin composition according to claim 1.

10. An optical device comprising the cured film according to claim 9.

11. The positive photosensitive resin composition according to claim 2, wherein $R^1$ in the general formula (1) contains a condensed polycyclic aromatic hydrocarbon radical.

12. The positive photosensitive resin composition according to claim 5, wherein the content of Si atoms originated from the organosilane represented by the general formula (2) in the polysiloxane containing metal compound particles (a') is 5 mol % or more and 50 mol % or less of the total content of Si atoms originated from the organosilane in the polysiloxane containing metal compound particles.

13. The positive photosensitive resin composition according to claim 11, wherein n in the general formula (1) is 1, and in the polysiloxane containing metal compound particles (a'), the content of Si atoms bound to $R^1$, which is a condensed polycyclic aromatic hydrocarbon radical, is 10 mol % or more of the total content of Si atoms originated from the organosilane.

14. A cured film formed by curing the positive photosensitive resin composition according to claim 2.

15. A cured film formed by curing the positive photosensitive resin composition according to claim 5.

* * * * *